United States Patent
Sato et al.

(10) Patent No.: US 9,257,570 B2
(45) Date of Patent: Feb. 9, 2016

(54) SEMICONDUCTOR MEMORY DEVICE AND METHOD FOR MANUFACTURING THE SAME

(71) Applicant: Kabushiki Kaisha Toshiba, Minato-ku (JP)

(72) Inventors: Hiroyasu Sato, Mie-ken (JP); Hiroaki Naito, Mie-ken (JP); Satoshi Nagashima, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/162,146

(22) Filed: Jan. 23, 2014

(65) Prior Publication Data

US 2015/0069487 A1  Mar. 12, 2015

Related U.S. Application Data

(60) Provisional application No. 61/876,990, filed on Sep. 12, 2013.

(51) Int. Cl.
| | |
|---|---|
| *H01L 29/788* | (2006.01) |
| *H01L 21/28* | (2006.01) |
| *H01L 29/66* | (2006.01) |
| *H01L 21/764* | (2006.01) |
| *H01L 27/115* | (2006.01) |

(52) U.S. Cl.
CPC ...... *H01L 29/7881* (2013.01); *H01L 21/28273* (2013.01); *H01L 21/764* (2013.01); *H01L 27/11521* (2013.01); *H01L 29/66825* (2013.01)

(58) Field of Classification Search
USPC .......................................................... 257/314
See application file for complete search history.

(56) References Cited

U.S. PATENT DOCUMENTS

| | | | |
|---|---|---|---|
| 2012/0126303 A1 | 5/2012 | Arai et al. | |
| 2012/0126306 A1* | 5/2012 | Kawaguchi et al. | 257/319 |
| 2012/0132985 A1 | 5/2012 | Kai et al. | |

* cited by examiner

*Primary Examiner* — Zandra Smith
*Assistant Examiner* — Lawrence Tynes, Jr.
(74) *Attorney, Agent, or Firm* — Oblon, McClelland, Maier & Neustadt, L.L.P.

(57) ABSTRACT

A semiconductor memory device according to an embodiment includes a semiconductor substrate, a first insulating film provided on the semiconductor substrate, a plurality of first electrodes provided on the first insulating film, a second insulating film provided on a side surface of the first electrodes and on an upper surface of the first electrodes, and a second electrode insulated from the first electrodes by the second insulating film. The second electrode includes an interconnect portion provided on the second insulating film, and a downward-extending portion extending into a space between the first electrodes from the interconnect portion. A lower end portion of the downward-extending portion is not covered with the second insulating film.

6 Claims, 29 Drawing Sheets

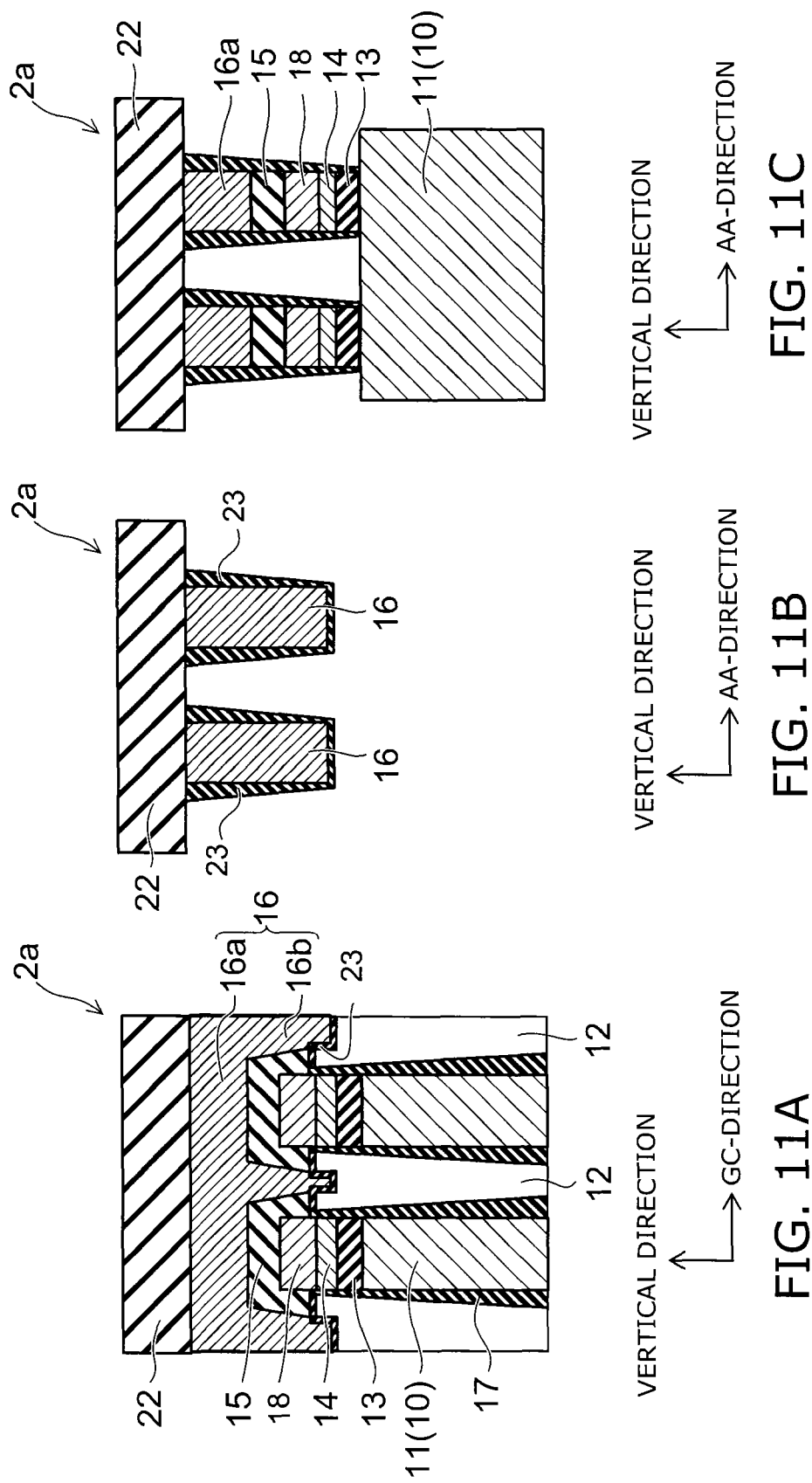

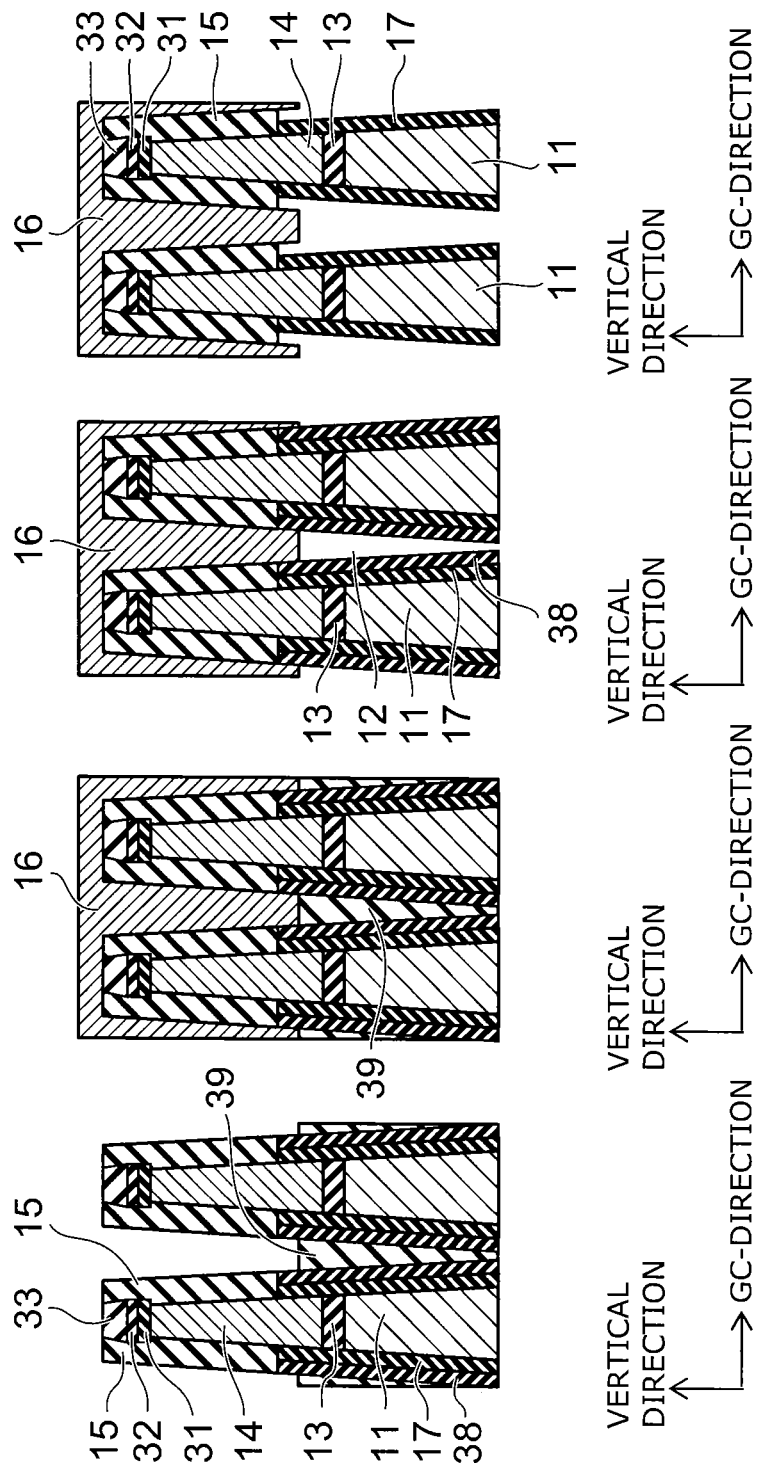

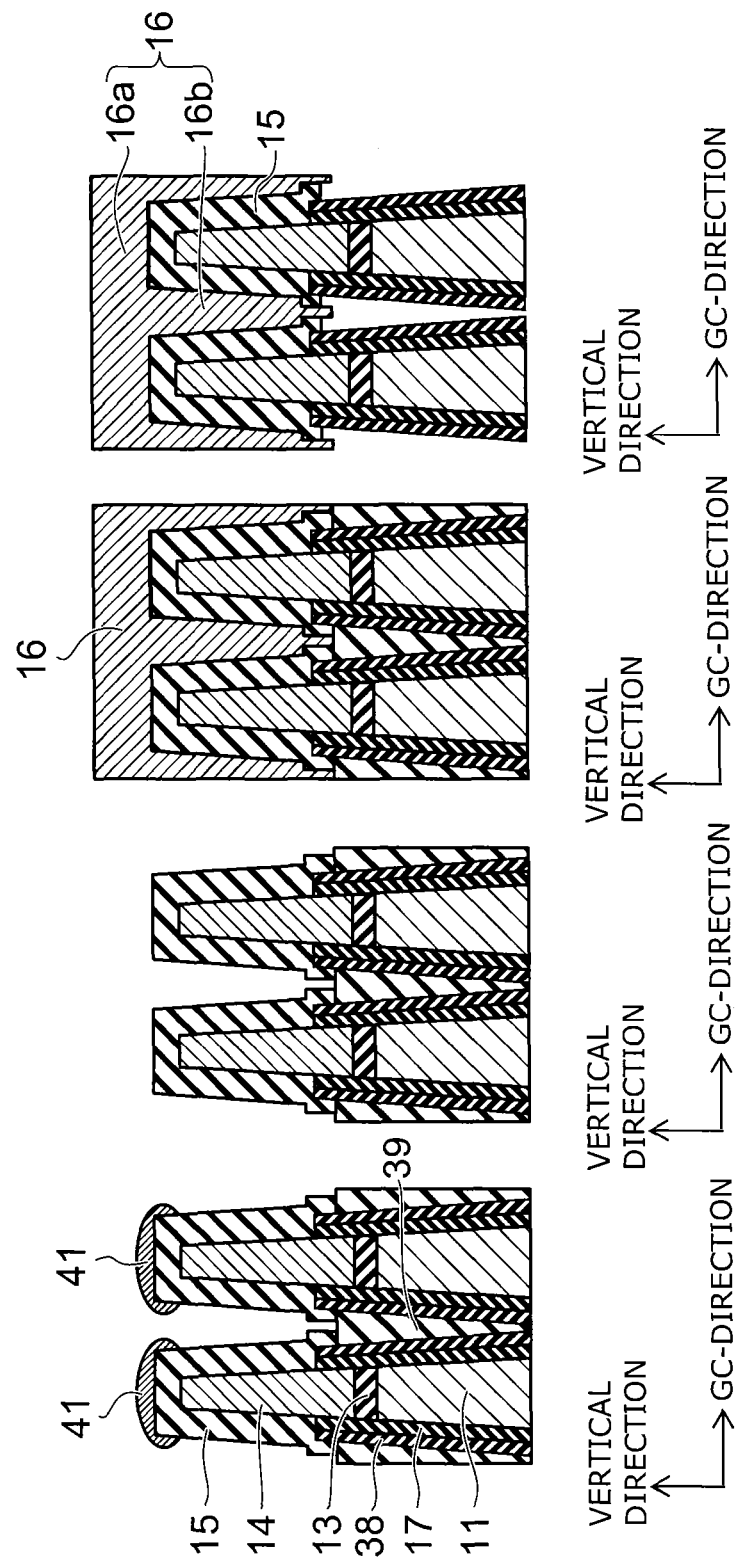

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 61/876,990, filed on Sep. 12, 2013; the entire contents of which are incorporated herein by reference.

FIELD

Embodiments described herein relate generally to a semiconductor memory device and a method for manufacturing the same.

BACKGROUND

NAND flash memory has been developed as a large-capacity nonvolatile memory device. In NAND flash memory, data is stored by storing charge in floating gate electrodes. However, interference between the floating gate electrodes becomes problematic when the cell structure of NAND flash memory is shrunk to increase the bit density. Although a method has been proposed in which a portion of the control gate electrode is extended into the space between the floating gate electrodes to suppress the interference between the floating gate electrodes, in such a case, the distance between the silicon substrate and the control gate electrode becomes short; and the breakdown voltage between the silicon substrate and the control gate electrode undesirably decreases.

BRIEF DESCRIPTION OF THE DRAWINGS

FIG. 11A to FIG. 11C are cross-sectional views showing a semiconductor memory device according to a modification of the second embodiment;

FIG. 12A to FIG. 14D are cross-sectional views of processes, showing a method for manufacturing a semiconductor memory device according to a third embodiment;

FIG. 15A to FIG. 18 are cross-sectional views of processes, showing a method for manufacturing a semiconductor memory device according to a forth embodiment;

FIG. 21A to FIG. 22C are cross-sectional views of processes, showing a method for manufacturing a semiconductor memory device according to a sixth embodiment;

DETAILED DESCRIPTION

A semiconductor memory device according to an embodiment includes a semiconductor substrate, a first insulating film provided on the semiconductor substrate, a plurality of first electrodes provided on the first insulating film, a second insulating film provided on a side surface of the first electrodes and on an upper surface of the first electrodes, and a second electrode insulated from the first electrodes by the second insulating film. The second electrode includes an interconnect portion provided on the second insulating film, and a downward-extending portion extending into a space between the first electrodes from the interconnect portion. A lower end portion of the downward-extending portion is not covered with the second insulating film.

Embodiments of the invention will now be described with reference to the drawings.

First Embodiment

First, a first embodiment will be described.

Figure 1:
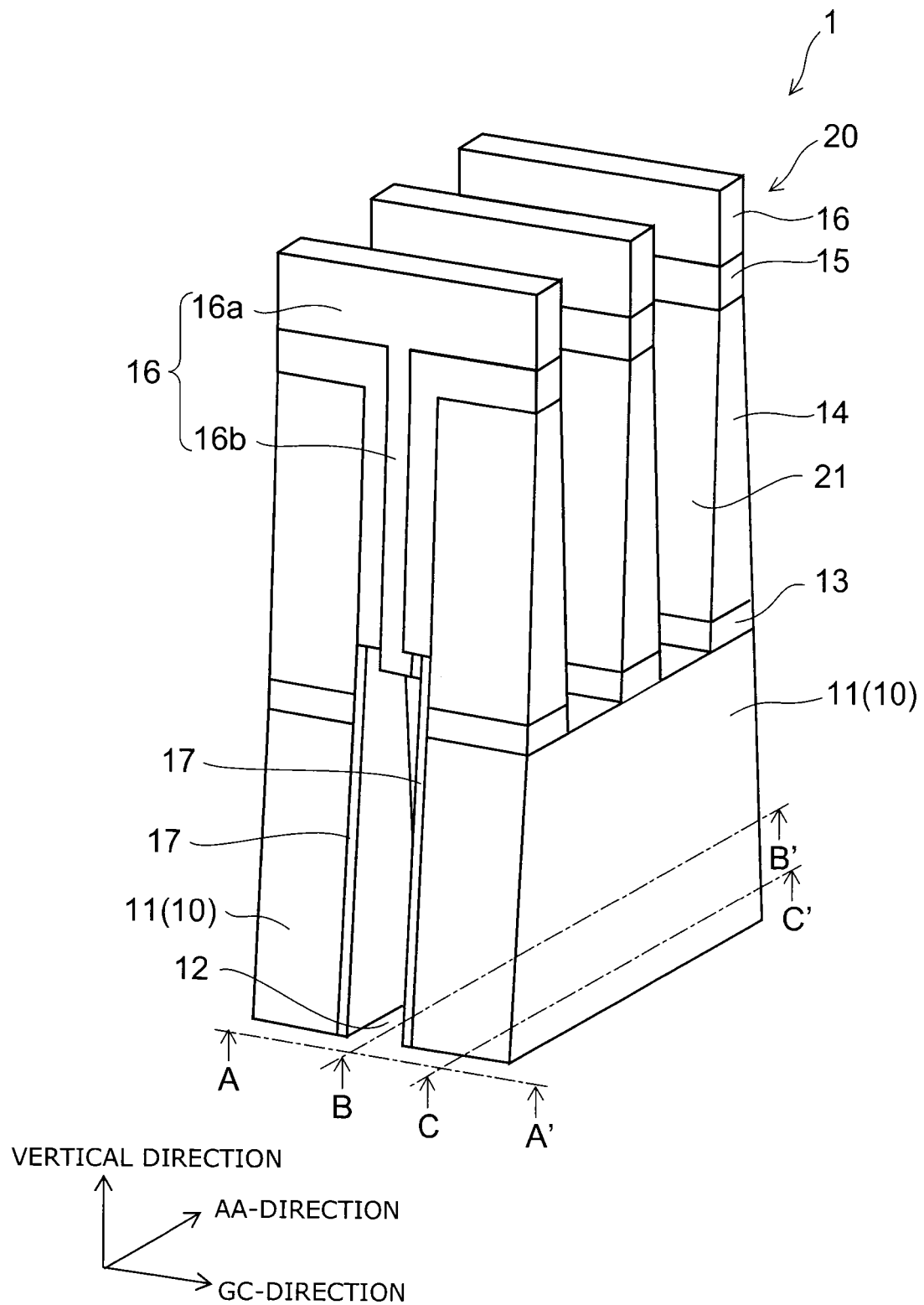
FIG. 1 is a perspective view showing a semiconductor memory device according to a first embodiment.

FIG. 1 is a perspective view showing a semiconductor memory device according to the embodiment.

Figures 2A, 2B, 2C:
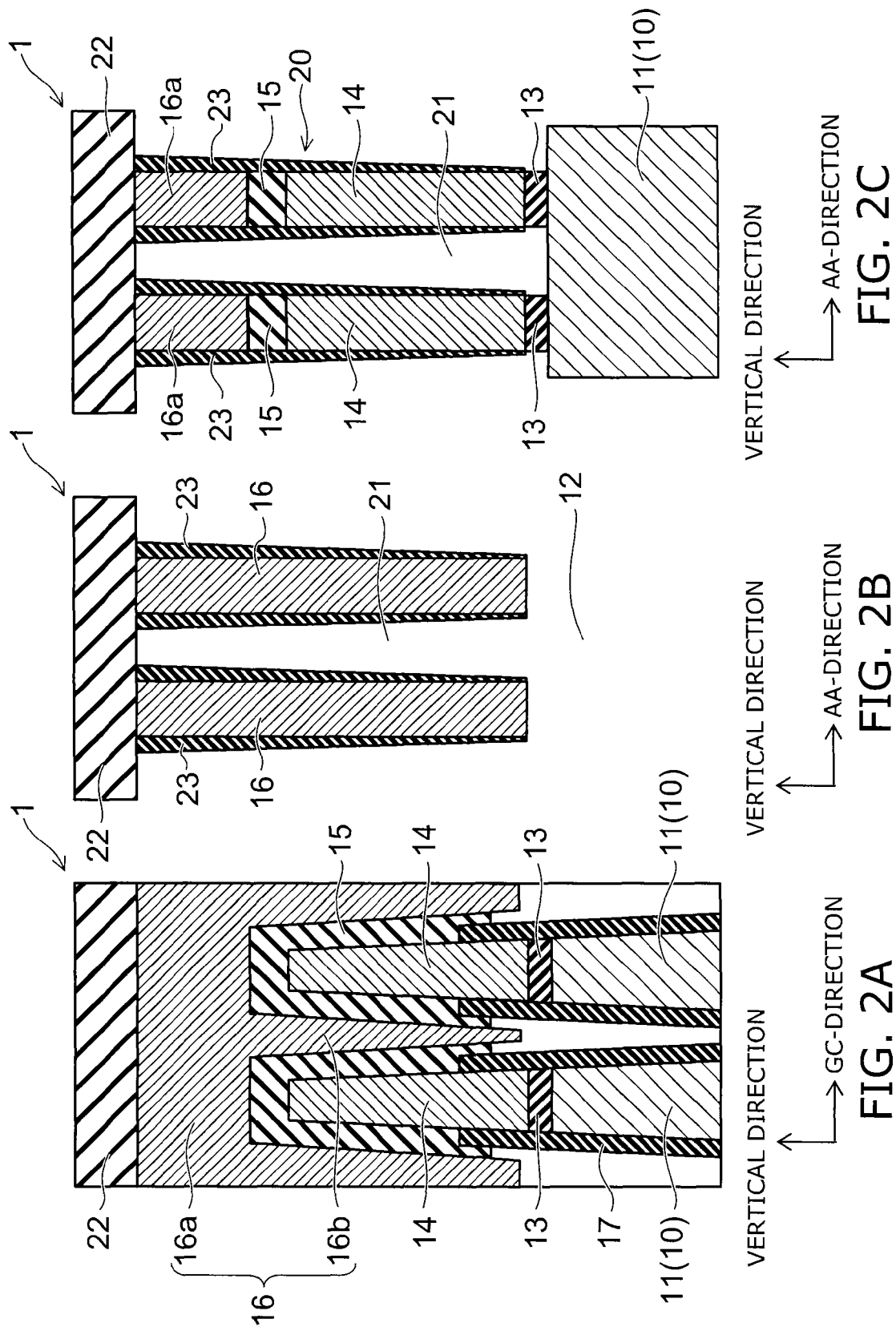
FIG. 2A to FIG. 2C are cross-sectional views showing the semiconductor memory device according to the first embodiment.

FIG. 2A to FIG. 2C are cross-sectional views showing the semiconductor memory device according to the embodiment. FIG. 2A shows the cross section along line A-A' shown in FIG. 1; FIG. 2B shows the cross section along line B-B' shown in FIG. 1; and FIG. 2C shows the cross section along line C-C' shown in FIG. 1.

As shown in FIG. 1 and FIG. 2A to FIG. 2C, the semiconductor memory device 1 (hereinbelow, also called simply the "device 1") according to the embodiment is a rocket-cell type NAND flash memory. A silicon substrate 10 is provided in the device 1. The upper portion of the silicon substrate 10 is divided into a stripe configuration extending in one direction and is used as active areas 11. Hereinbelow, the direction in which the active areas 11 extend is called the "AA-direction." The space between the active areas 11 becomes an air gap 12.

A tunneling insulating film 13 is provided on the active areas 11. Although the tunneling insulating film 13 normally is insulative, the tunneling insulating film 13 is a film in which a tunneling current is caused to flow when a prescribed voltage within the range of the drive voltage of the device 1 is applied and is formed of, for example, silicon oxide. The tunneling insulating film 13 is provided intermittently along the AA-direction. Therefore, the tunneling insulating film 13 is arranged in a matrix configuration along the AA-direction and the GC-direction as viewed from a direction (hereinbelow, called the "vertical direction") perpendicular to the upper surface of the silicon substrate 10. The "GC-direction" is a direction perpendicular to both the "AA-direction" and the "vertical direction."

A floating gate electrode 14 is provided in the region directly above the tunneling insulating film 13. The floating gate electrode 14 is formed of a conductive material, e.g., polysilicon that contains an impurity. The floating gate electrode 14 also is arranged in a matrix configuration along the AA-direction and the GC-direction as viewed from above.

An IPD (Inter Poly Dielectric) film 15 is provided on the side surfaces of the floating gate electrode 14 facing the GC-direction and on the upper surface of the floating gate electrode 14. However, the IPD film 15 is not provided on the side surfaces of the lowermost portion of the floating gate electrode 14 facing the GC-direction. The side surfaces of the lowermost portion of the gate electrode 14 that face the GC-direction face the air gap 12. The IPD film 15 is a film in which a current substantially does not flow even when the voltage within the range of the drive voltage of the device 1 is applied. The IPD film 15 is, for example, a single-layer silicon nitride film or a stacked film of a silicon oxide layer and a silicon nitride layer.

A control gate electrode 16 is provided on the side surfaces of the IPD film 15 facing the GC-direction and on the upper surface of the IPD film 15. The control gate electrode 16 is formed of a conductive material, e.g., polysilicon that contains an impurity. The control gate electrode 16 is insulated from the floating gate electrode 14 by the IPD film 15. The control gate electrode 16 includes an interconnect portion 16a that is provided on the IPD film 15 to extend in the GC-direction, and a downward-extending portion 16b that extends downward from the interconnect portion 16a to enter between the IPD films 15 that are adjacent to each other in the GC-direction. The interconnect portion 16a and the downward-extending portion 16b are formed integrally.

A liner silicon oxide film 17 is provided on the side surfaces of the active area 11, the tunneling insulating film 13, and the lower portion of the floating gate electrode 14. The surfaces of the liner silicon oxide film 17 face the air gap 12.

Also, the lower end portion of the downward-extending portion 16b is not covered with the IPD film 15 and is disposed inside the air gap 12. In other words, the lower end portion of the downward-extending portion 16b protrudes from the space between the IPD films 15 downward into the air gap 12. Also, the lower end portion of the downward-extending portion 16b is separated from the liner silicon oxide film 17. In other words, the air gap 12 is made around the lower end portion of the downward-extending portion 16b.

A gate stacked body 20 that extends in the GC-direction is formed of the tunneling insulating films 13, the floating gate electrodes 14, the IPD films 15, the control gate electrode 16, and the liner silicon oxide films 17. The gate stacked body 20 is arranged periodically along the AA-direction. The space between the gate stacked bodies 20 on the silicon substrate 10 becomes an air gap 21. An inter-layer insulating film 22 is provided above the gate stacked bodies 20 and the air gap 21. Also, a silicon oxide film 23 is provided on the side surfaces of the gate stacked bodies 20 facing the AA-direction. The silicon oxide film 23 is thinner downward.

The air gap 12 communicates with the air gap 21. Although it is favorable for the air gap 12 and the air gap 21 to be a vacuum or to be filled with an inert gas such as nitrogen gas, etc., the air gap 12 and the air gap 21 may be filled with ambient air.

Operations and effects of the embodiment will now be described.

Figure 3:
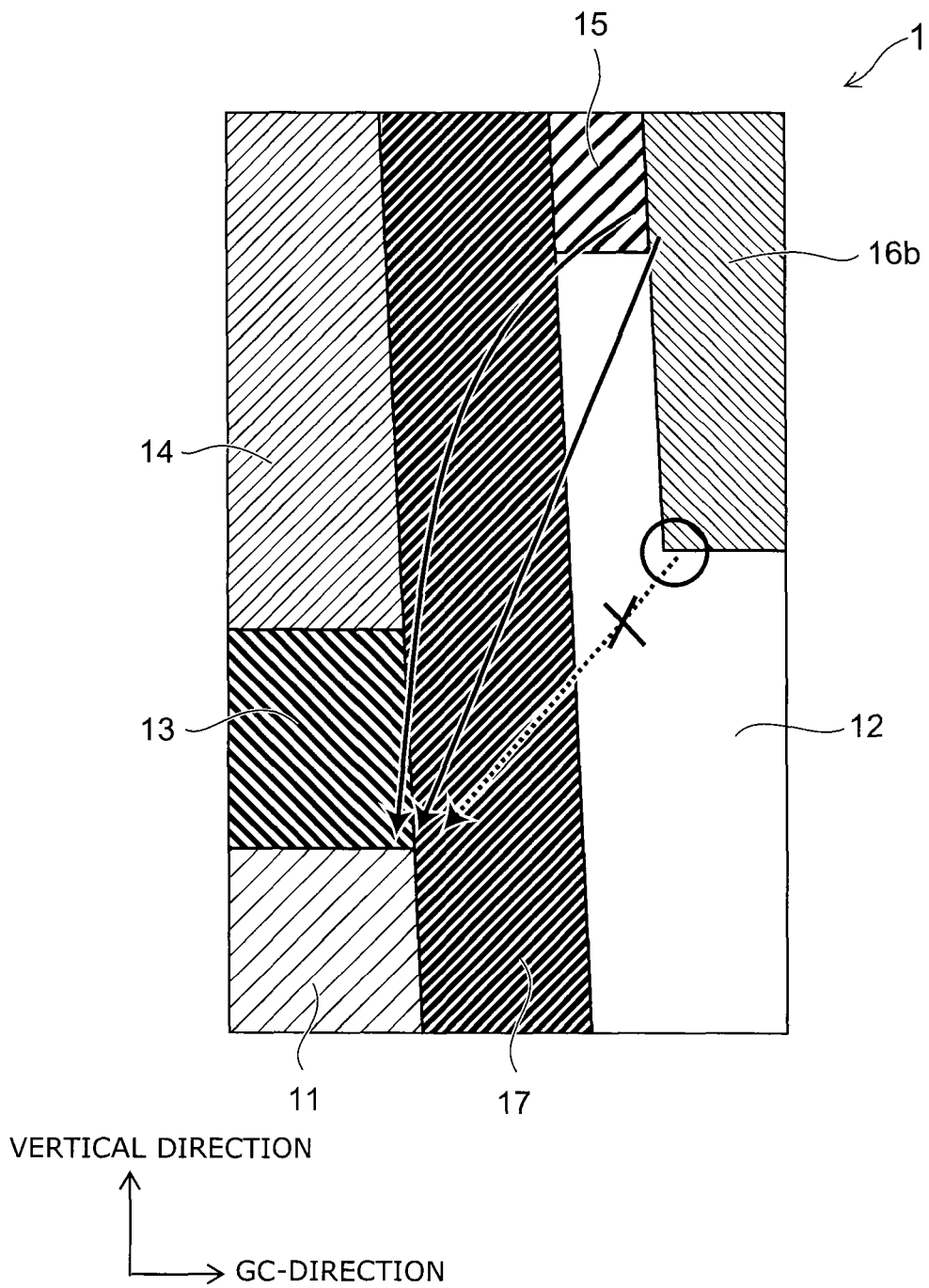
FIG. 3 is a partial cross-sectional view showing an operation of the semiconductor memory device according to the first embodiment.

FIG. 3 is a partial cross-sectional view showing an operation of the semiconductor memory device according to the embodiment.

In the semiconductor memory device 1 according to the embodiment as shown in FIG. 3, the downward-extending portion 16b of the control gate electrode 16 extends to the vicinity of the space between the lower end portions of the floating gate electrodes 14. Thereby, interference between the floating gate electrodes 14 that are adjacent to each other in the GC-direction can be suppressed.

Further, in the device 1, the air gap 12 is interposed between the active area 11 and the lower end portion of the downward-extending portion 16b of the control gate electrode 16. Thereby, the breakdown voltage between the control gate electrode 16 and the active area 11 can be increased. In particular, because the corner of the lower end portion of the downward-extending portion 16b is not covered with the IPD film 15, the electric field concentration at the corner can be relaxed.

Furthermore, in the device 1, the value of the ratio of the capacitance between the control gate electrode 16 and the floating gate electrode 14 to the capacitance between the active area 11 and the floating gate electrode 14, i.e., the coupling ratio (CR), can be increased. Therefore, the injection of charge from the active area 11 into the floating gate electrode 14 is easy.

Thus, according to the embodiment, even in the case where the cell structure is downscaled to increase the bit density of the semiconductor memory device, the interference between the floating gate electrodes can be suppressed; and the breakdown voltage between the silicon substrate and the control gate electrode can be ensured.

Comparative Example

A comparative example will now be described.

Figure 4:
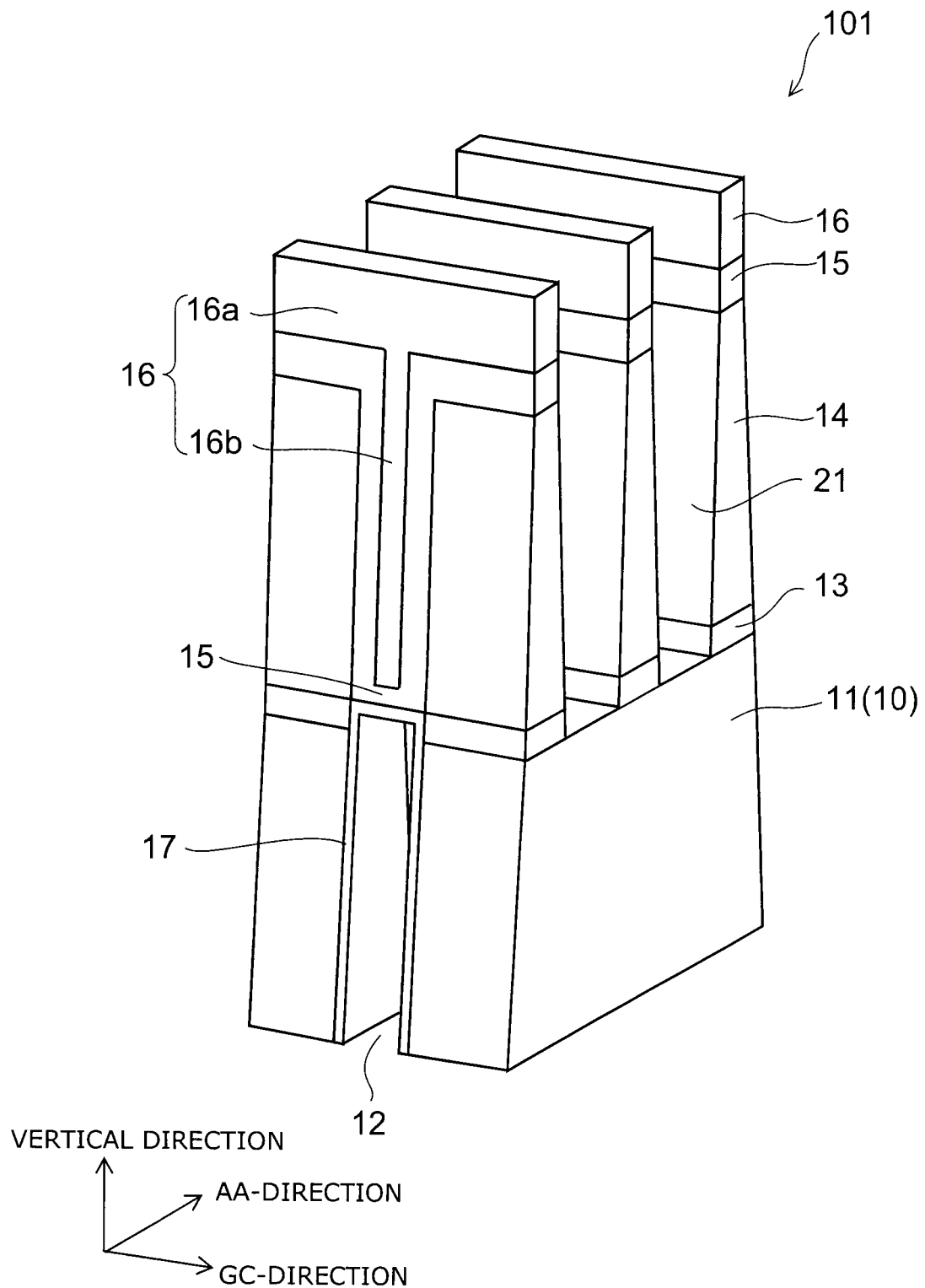
FIG. 4 is a perspective view showing a semiconductor memory device according to a comparative example.

FIG. 4 is a perspective view showing a semiconductor memory device according to the comparative example.

Figure 5:
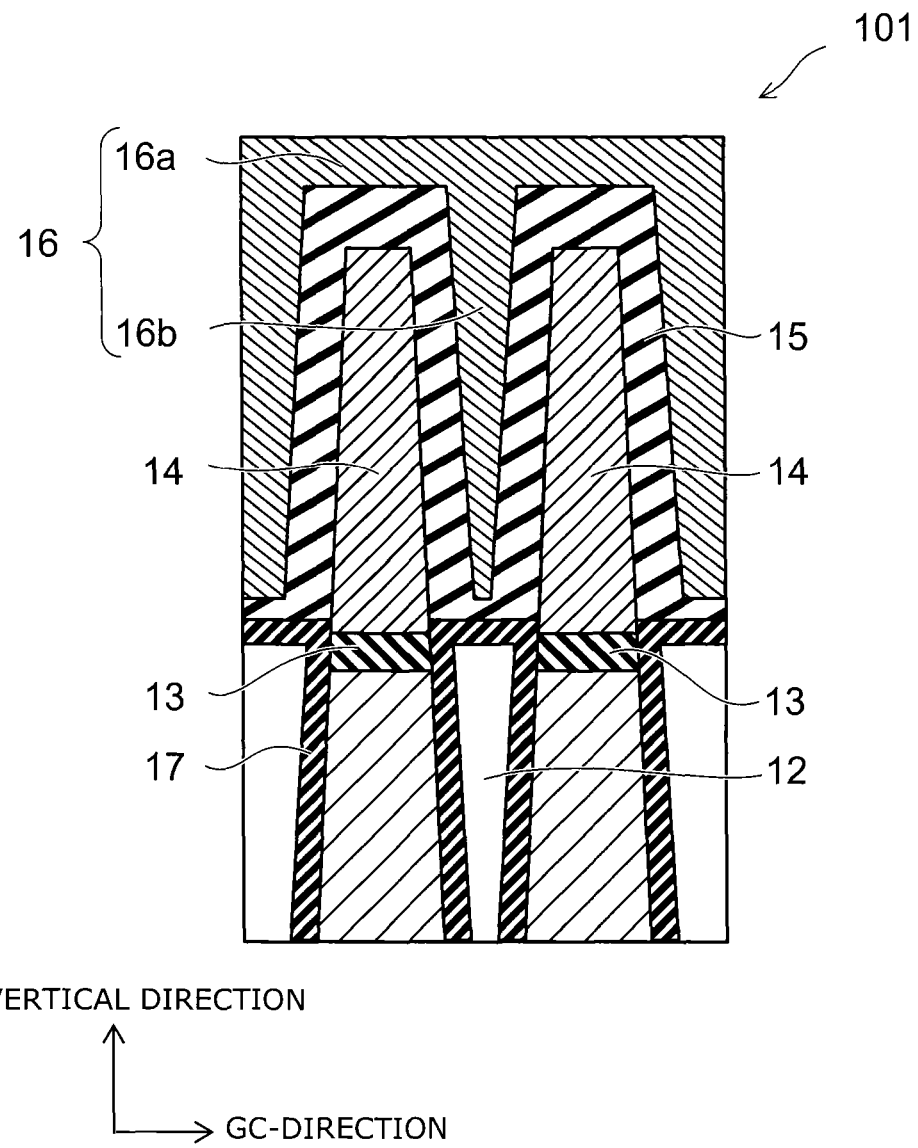
FIG. 5 is a cross-sectional view showing the semiconductor memory device according to the comparative example.

FIG. 5 is a cross-sectional view showing the semiconductor memory device according to the comparative example.

Figure 6:
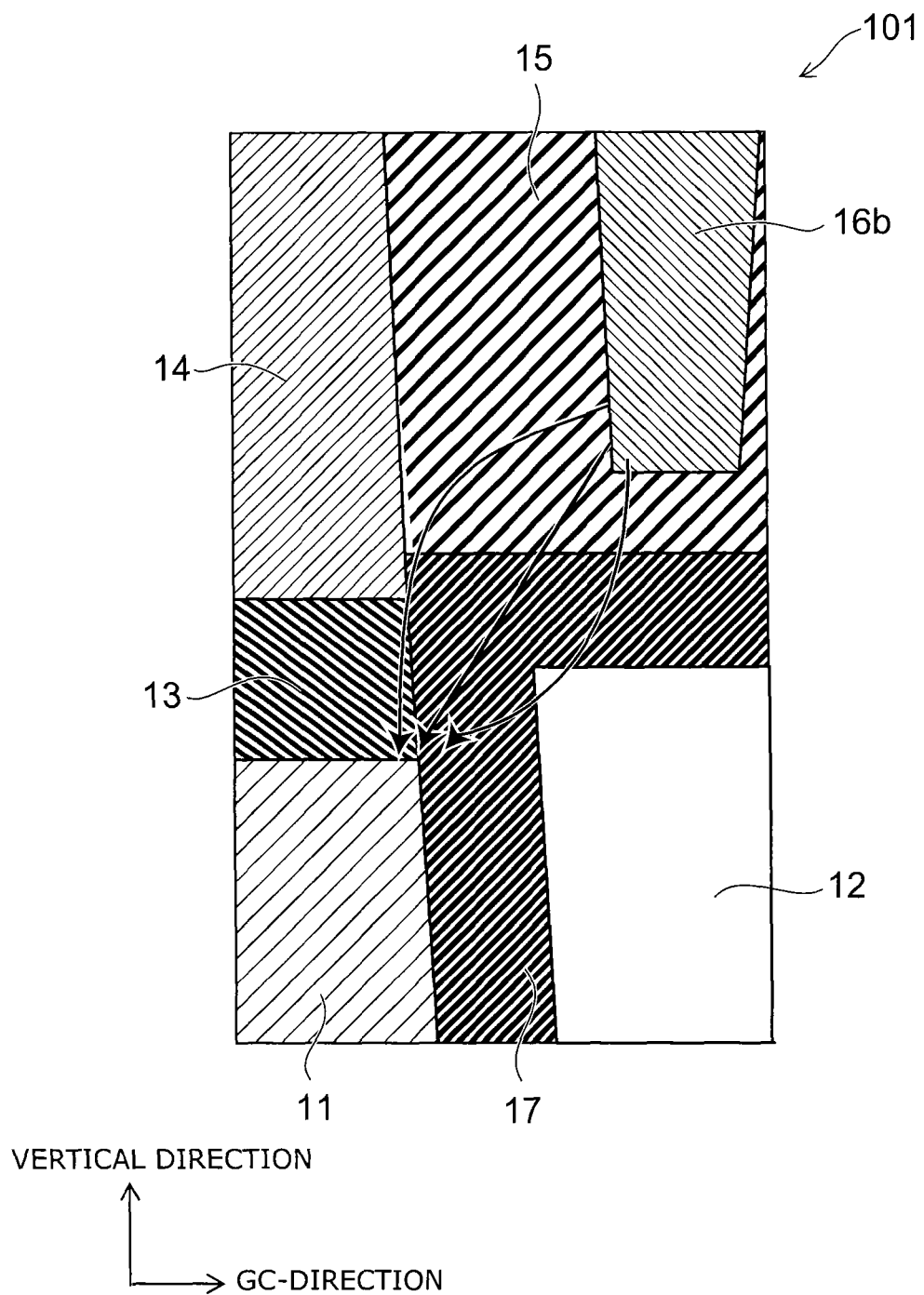
FIG. 6 is a partial cross-sectional view showing an operation of the semiconductor memory device according to the comparative example.

FIG. 6 is a partial cross-sectional view showing an operation of the semiconductor memory device according to the comparative example.

In the semiconductor memory device 101 according to the comparative example as shown in FIG. 4 and FIG. 5, the lower end portion of the downward-extending portion 16b of the control gate electrode 16 is covered with the IPD film 15. Also, the liner silicon oxide film 17 is disposed between the IPD film 15 and the air gap 12.

Accordingly, in the device 101 as shown in FIG. 6, the IPD film 15 and the liner silicon oxide film 17 are interposed between the active area 11 and the lower end portion of the downward-extending portion 16b. Therefore, in the case where the downward-extending portion 16b extends to the vicinity of the space between the lower end portions of the floating gate electrodes 14 to suppress the interference between the floating gate electrodes 14, the breakdown voltage between the control gate electrode 16 and the active area 11 undesirably decreases. Also, because the corner of the lower end portion of the downward-extending portion 16b is covered with the IPD film 15 that has a high dielectric constant, the electric field undesirably concentrates at the corner.

Modification of First Embodiment

A modification of the first embodiment will now be described.

Figure 7:
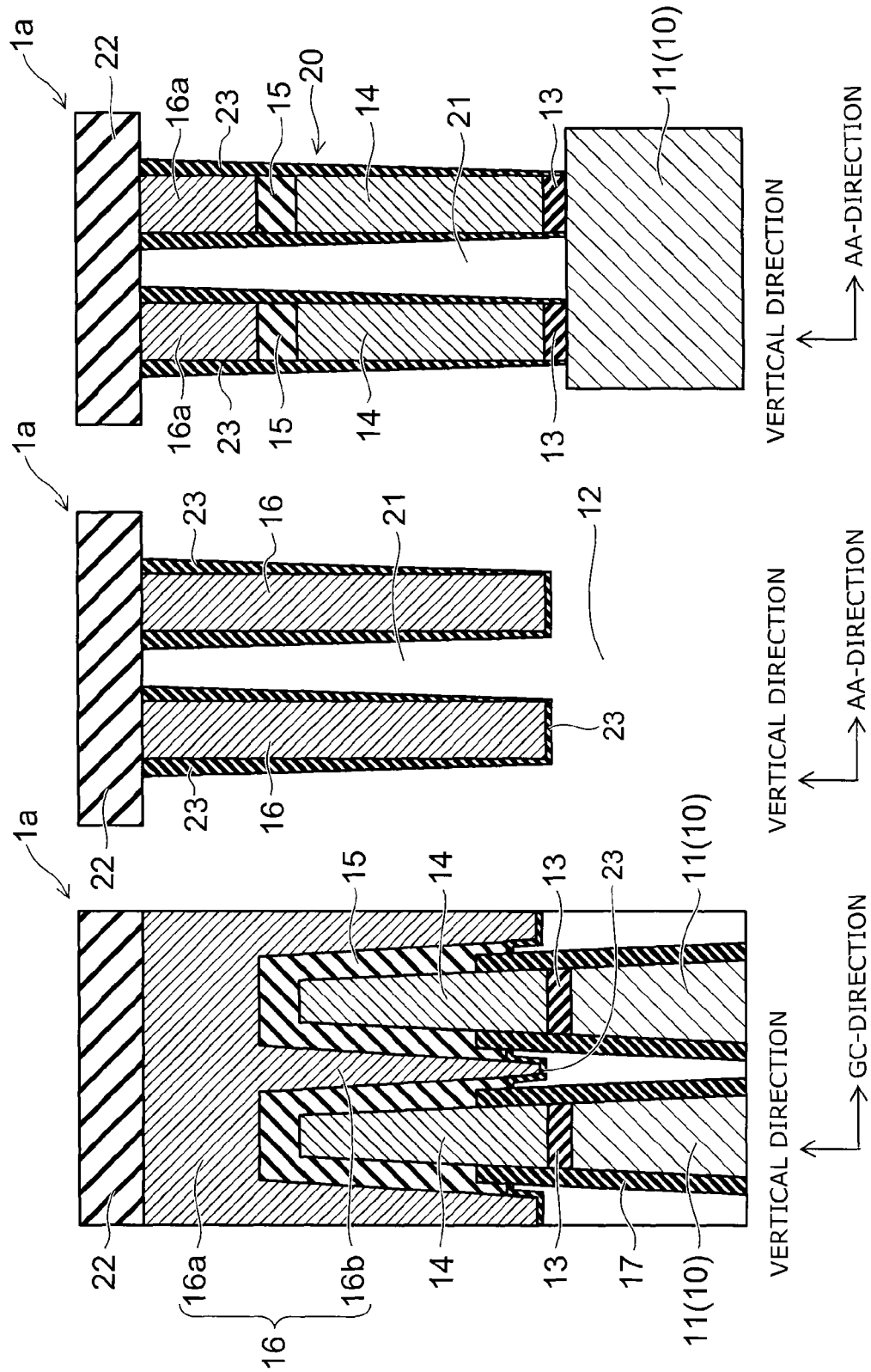
FIG. 7A to FIG. 7C are cross-sectional views showing a semiconductor memory device according to a modification of the first embodiment.

FIG. 7A to FIG. 7C are cross-sectional views showing the semiconductor memory device according to the modification.

FIG. 7A to FIG. 7C are cross sections corresponding to FIG. 2A to FIG. 2C.

As shown in FIG. 7A to FIG. 7C, the semiconductor memory device 1a according to the modification differs from the device 1 (referring to FIG. 2A to FIG. 2C) according to the first embodiment described above in that the silicon oxide film 23 also covers the lower surface of the IPD film 15 and the side surfaces facing the GC-direction and lower surface of the portion of the downward-extending portion 16b of the control gate electrode 16 protruding from the IPD film 15. The portion of the silicon oxide film 23 that covers the downward-extending portion 16b is thinner than the portion of the silicon oxide film 23 that covers the lower surface of the downward-extending portion 16b side surfaces.

In the modification as well, effects similar to those of the first embodiment can be obtained because the air gap 12 is interposed between the control gate electrode 16 and the active area 11.

Second Embodiment

A second embodiment will now be described.

Figure 8:
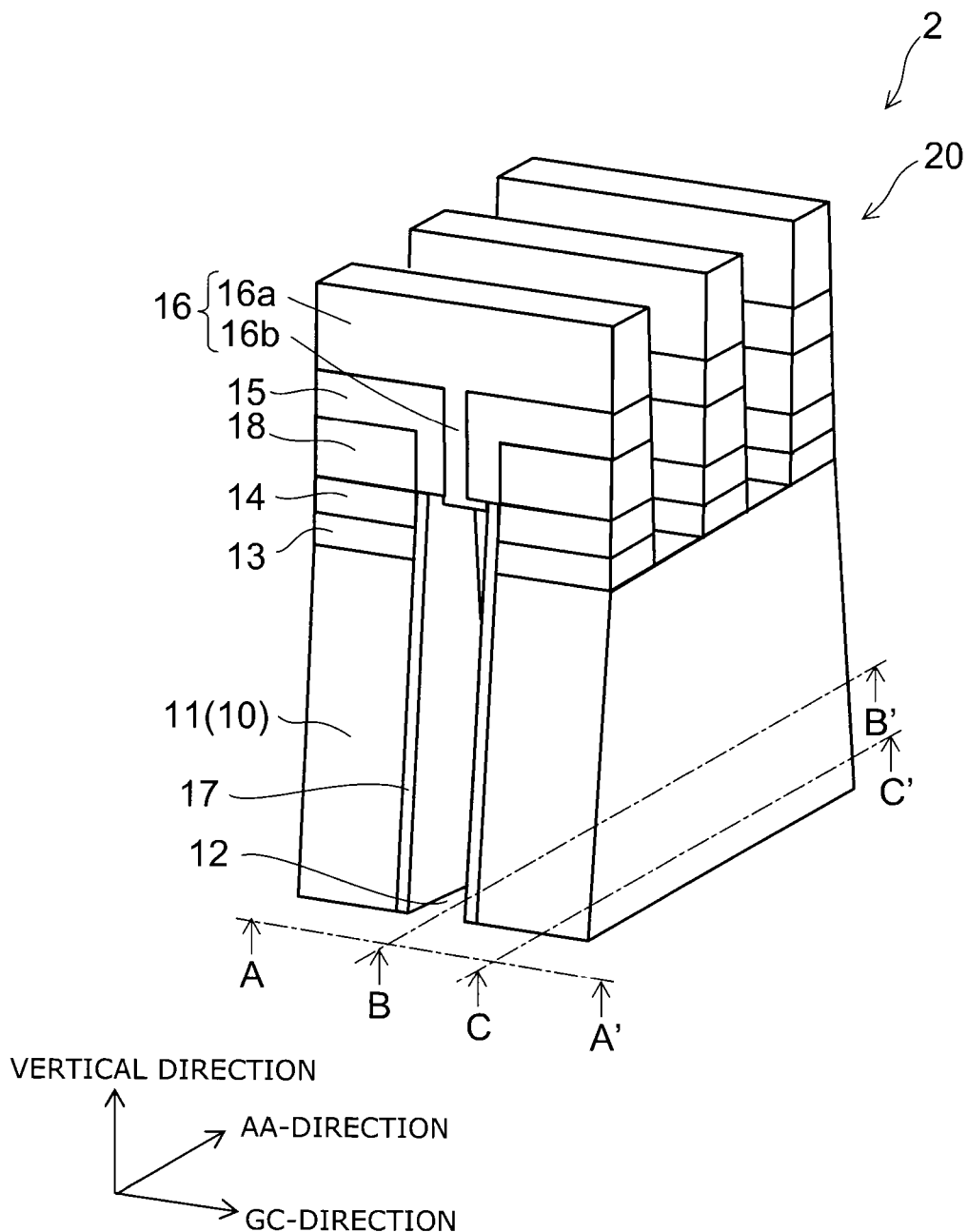
FIG. 8 is a perspective view showing a semiconductor memory device according to a second embodiment.

FIG. 8 is a perspective view showing a semiconductor memory device according to the embodiment.

Figure 9:
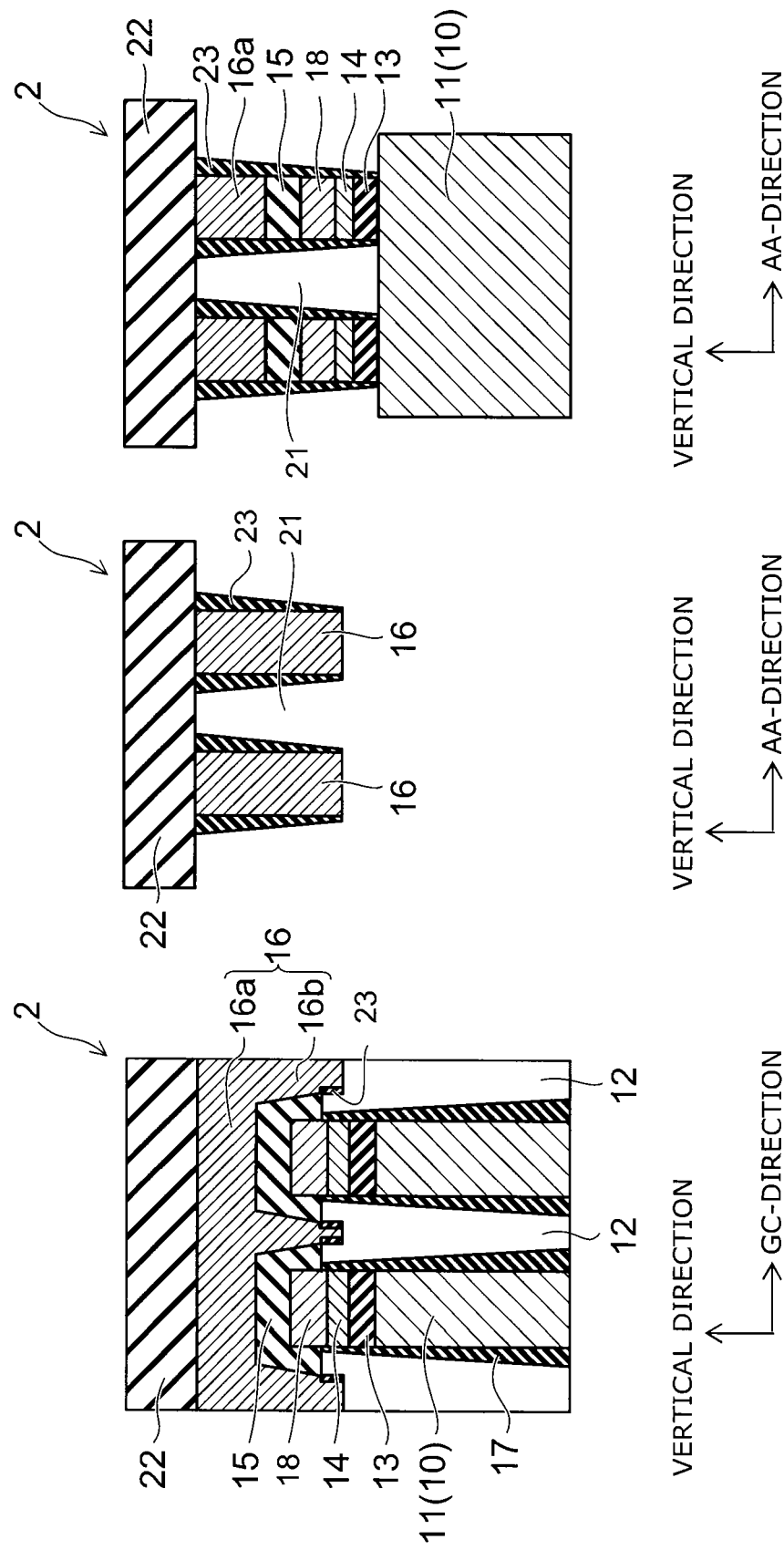
FIG. 9A to FIG. 9C are cross-sectional views showing the semiconductor memory device according to the second embodiment.

FIG. 9A to FIG. 9C are cross-sectional views showing the semiconductor memory device according to the embodiment. FIG. 9A shows the cross section along line A-A' shown in FIG. 8; FIG. 9B shows the cross section along line B-B' shown in FIG. 8; and FIG. 9C shows the cross section along line C-C' shown in FIG. 8.

As shown in FIG. 8 and FIG. 9A to FIG. 9C, the semiconductor memory device 2 according to the embodiment is a flat-cell NAND flash memory. The floating gate electrode 14 of the device 2 is thinner than the floating gate electrode 14 of the device 1; and a charge trap film 18 is provided between the floating gate electrode 14 and the IPD film 15.

In the device 2 as well, the lower end portion of the downward-extending portion 16b of the control gate electrode 16 is not covered with the IPD film 15 and protrudes into the air gap 12. The side surfaces of the lower end portion of the downward-extending portion 16b are covered with the silicon oxide film 23; but the lower surface of the lower end portion of the downward-extending portion 16b is not covered with the silicon oxide film 23.

Operations and effects of the embodiment will now be described.

Figure 10:
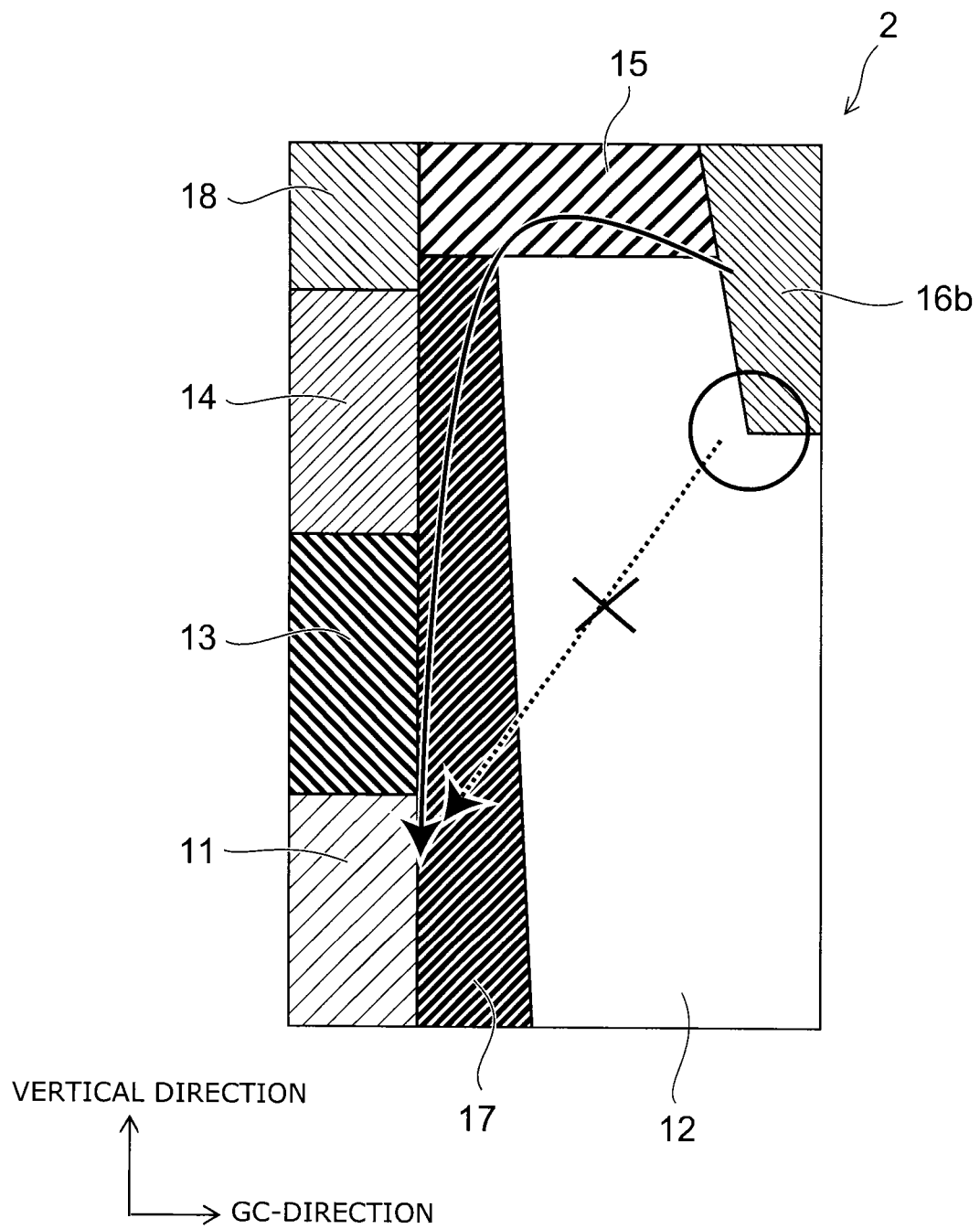
FIG. 10 is a partial cross-sectional view showing an operation of the semiconductor memory device according to the second embodiment.

FIG. 10 is a partial cross-sectional view showing an operation of the semiconductor memory device according to the embodiment.

As shown in FIG. 10, in the semiconductor memory device 2 according to the embodiment as well, similarly to the device 1 according to the first embodiment described above, the interference between the floating gate electrodes 14 that are adjacent to each other in the GC-direction can be suppressed by the downward-extending portion 16b of the control gate electrode 16 extending to the vicinity of the space between the lower end portions of the floating gate electrodes 14.

Also, in the device 2 as well, the breakdown voltage between the control gate electrode 16 and the active area 11 can be increased because the air gap 12 is interposed between the active area 11 and the lower end portion of the downward-extending portion 16b. In particular, because the corner of the lower end portion of the downward-extending portion 16b is not covered with the IPD film 15, the electric field concentration at the corner can be relaxed. In particular, these effects are large for flat-cell NAND flash memory because the IPD film 15 is formed of a high dielectric constant material. Also, by increasing the breakdown voltage, the erasing voltage can be set to be high. Thereby, the weakness of flat-cell NAND flash memory, that is, the characteristic of being difficult to erase, can be compensated.

Furthermore, in the device 2 as well, a high coupling ratio (CR) can be ensured. Therefore, the injection of charge from the active area 11 into the floating gate electrode 14 is easy.

Modification of Second Embodiment

A modification of the second embodiment will now be described.

FIG. 11A to FIG. 11C are cross-sectional views showing a semiconductor memory device according to the modification.

FIG. 11A to FIG. 11C show cross sections corresponding to FIG. 9A to FIG. 9C.

As shown in FIG. 11A to FIG. 11C, the semiconductor memory device 2a according to the modification differs from the device 2 (referring to FIG. 9A to FIG. 9C) according to the second embodiment described above in that the silicon oxide film 23 also covers the lower surface of the IPD film 15 and the side surfaces facing the GC-direction and lower surface of the portion of the downward-extending portion 16b of the control gate electrode 16 protruding from the IPD film 15. The portion of the silicon oxide film 23 that covers the lower surface of the downward-extending portion 16b is thinner than the portion of the silicon oxide film 23 that covers the downward-extending portion 16b side surfaces.

In the modification as well, effects similar to those of the second embodiment can be obtained because the air gap 12 is interposed between the control gate electrode 16 and the active area 11.

Third Embodiment

A third embodiment will now be described.

The embodiment is an embodiment of a method for manufacturing the semiconductor memory device according to the first embodiment described above.

FIG. 12A to FIG. 14D are cross-sectional views of processes, showing the method for manufacturing the semiconductor memory device according to the embodiment.

Figures 12A, 12B, 12C, 12D:
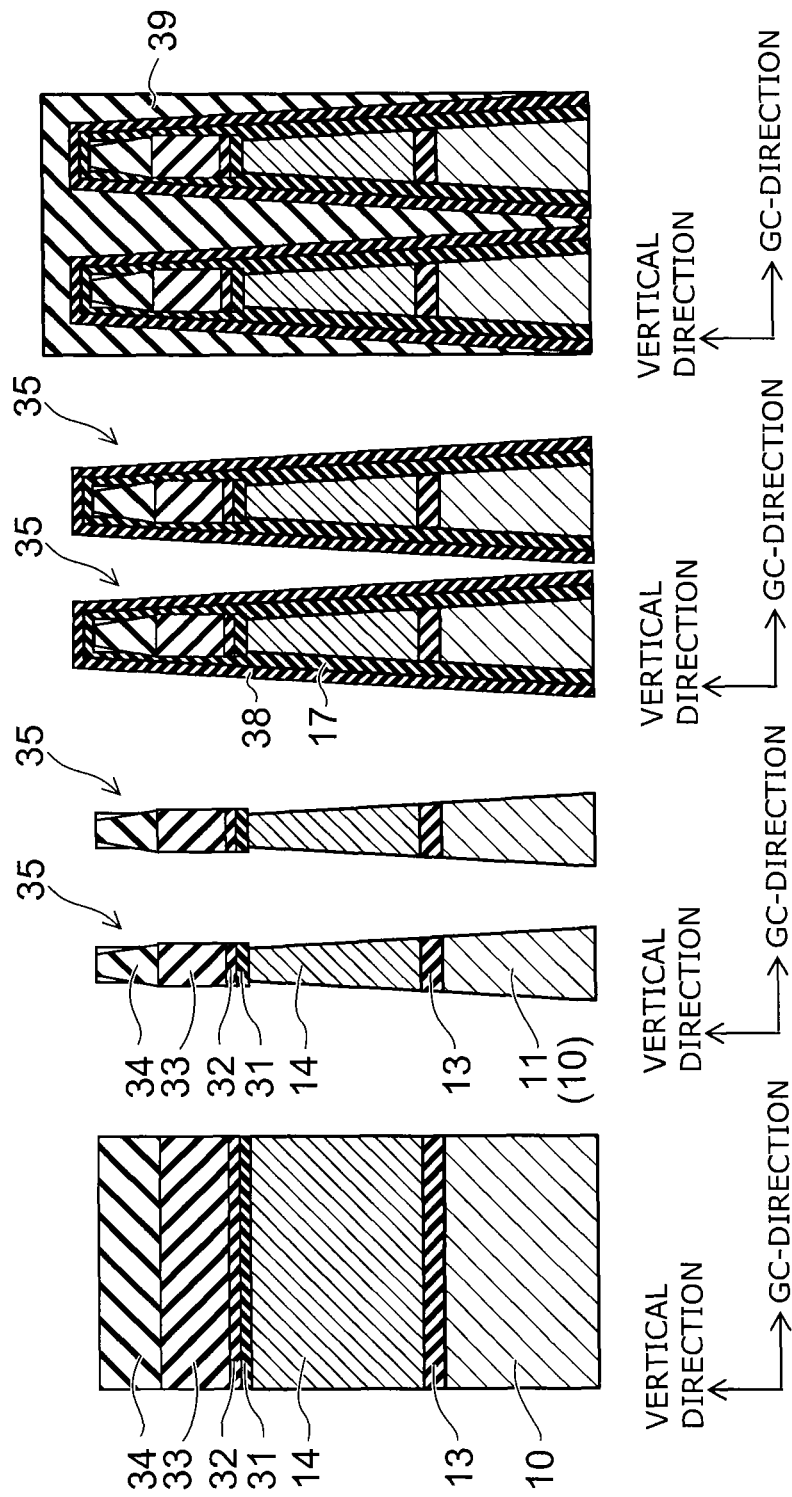

First, as shown in FIG. 12A, the tunneling insulating film 13 is formed on the entire surface of the silicon substrate 10 by depositing silicon oxide; the floating gate electrode 14 is formed on the tunneling insulating film 13; and a silicon oxide film 31, a silicon nitride film 32, a silicon oxide film 33, and a silicon nitride film 34 are deposited in this order on the floating gate electrode 14 by ALD (atomic layer deposition). A hard mask is formed of the silicon oxide film 31, the silicon nitride film 32, the silicon oxide film 33, and the silicon nitride film 34.

Then, as shown in FIG. 12B, the silicon nitride film 34, the silicon oxide film 33, the silicon nitride film 32, the silicon oxide film 31, the floating gate electrode 14, and the tunneling insulating film 13 are selectively removed; and continuing, the upper portion of the silicon substrate 10 is selectively removed. Thereby, stacked bodies 35 that extend in the AA-direction are formed; and the upper portion of the silicon substrate 10 is divided into the multiple active areas 11.

Then, as shown in FIG. 12C, the liner silicon oxide film 17 and a liner silicon nitride film 38 are formed to cover the stacked bodies 35.

Then, as shown in FIG. 12D, a silicon oxide film 39 is formed by coating PSZ (polysilazane) onto the entire surface and by heating.

Figures 13A, 13B, 13C, 13D:
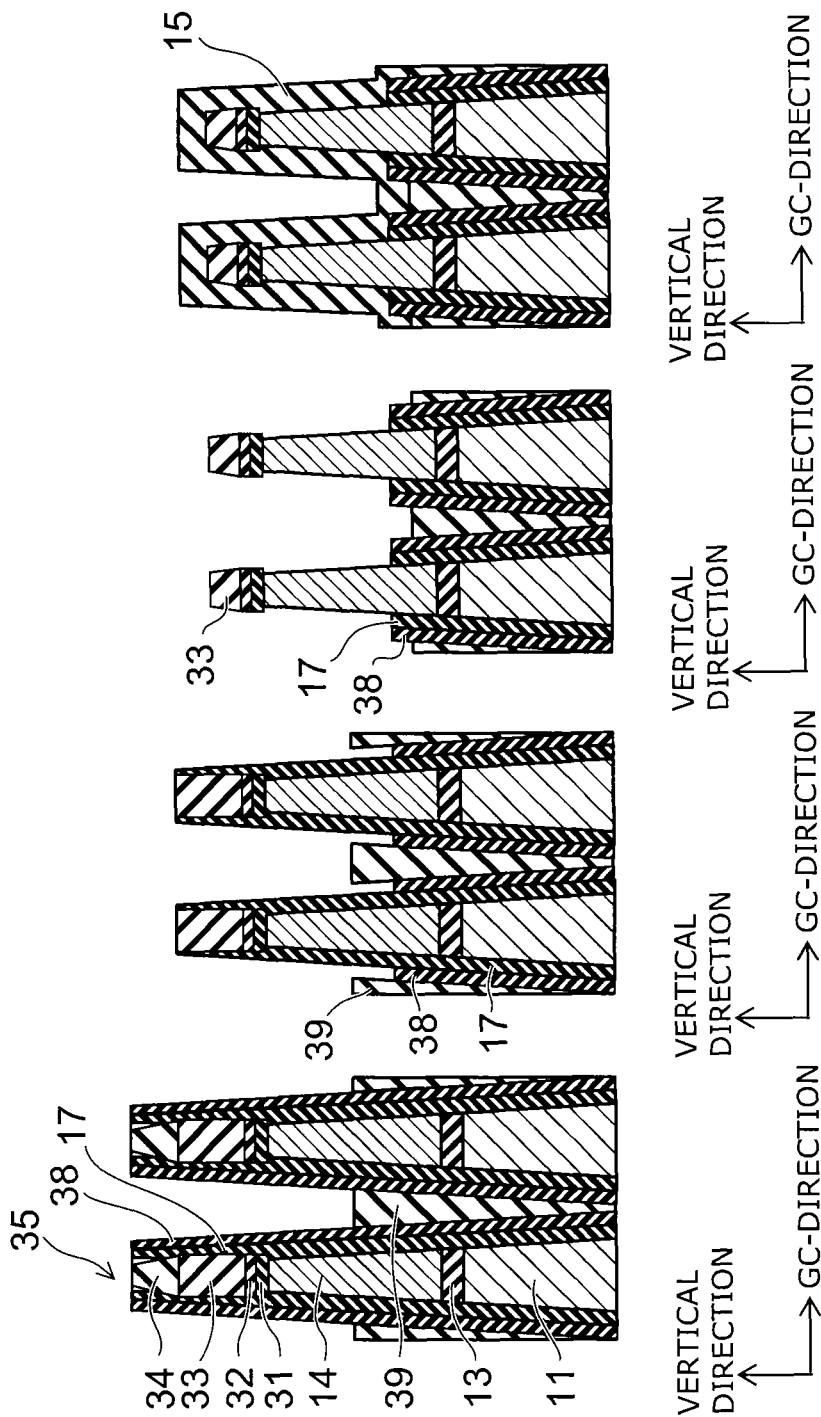

Then, as shown in FIG. 13A, dry etching is performed using conditions at which silicon oxide is etched preferentially to silicon nitride. Thereby, the upper surface of the silicon oxide film 39 recedes to the vicinity of the vertical-direction central portion of the floating gate electrode 14. At this time, the upper end portion of the liner silicon nitride film 38 and the upper end portion of the liner silicon oxide film 17 also are removed Then, as shown in FIG. 13B, wet etching is performed for a short period of time using phosphoric acid as the etchant. Thereby, the entire silicon nitride film 34 is removed; and the exposed portion of the liner silicon nitride film 38 is removed. At this time, the upper portion of the portion of the liner silicon nitride film 38 disposed between the liner silicon oxide film 17 and the silicon oxide film 39 also is removed.

Then, as shown in FIG. 13C, dry etching is performed using conditions at which silicon oxide is etched preferentially to silicon nitride. Thereby, the upper portion of the silicon oxide film 33, the upper portion of the silicon oxide film 39, and the exposed portion of the liner silicon oxide film 17 are removed.

Then, as shown in FIG. 13D, the IPD film 15 is deposited on the entire surface after performing pre-processing.

Then, as shown in FIG. 14A, RIE (reactive ion etching) is performed. Thereby, the portion of the IPD film 15 that is disposed on the upper surface of the silicon oxide film 33 and the portion of the IPD film 15 that is disposed on the upper surface of the silicon oxide film 39 are removed. The upper portion of the silicon oxide film 33 also is removed.

Then, as shown in FIG. 14B, the control gate electrode 16 is formed on the entire surface by depositing polysilicon. Subsequently, a hard mask member (not shown) for patterning the control gate electrode 16 is stacked on the control gate electrode 16; and the structural body that is stacked on the silicon substrate 10 is selectively removed by etching using the hard mask member as a mask. Thereby, the gate stacked bodies 20 that extend in the GC-direction are formed; and the space between the gate stacked bodies 20 is used as the air gap 21.

Then, as shown in FIG. 14C, the silicon oxide film 39 is removed by performing wet etching using DHF (diluted hydrofluoric acid) as the etchant. Thereby, the air gap 12 is made between the active areas 11. At this time, the processing time of the wet etching can be set to be sufficiently long and the fluctuation of the depth of the air gap 12 can be reduced because the liner silicon oxide film 17 and the tunneling insulating film 13 are protected by the liner silicon nitride film 38.

Then, as shown in FIG. 14D, the liner silicon nitride film 38 is removed by performing wet etching using phosphoric acid as the etchant. Thereby, the lower end portion of the downward-extending portion 16b of the control gate electrode 16 is exposed inside the air gap 12. At this time, the lower portion of the IPD film 15 also is removed slightly.

Subsequently, the inter-layer insulating film 22 is formed above the gate stacked bodies 20 and the air gap 21. At this time, the silicon oxide film 23 adheres over the side surfaces of the gate stacked bodies 20. The film thickness of the silicon oxide film 23 decreases downward.

Thus, the semiconductor memory device 1 according to the first embodiment described above is manufactured. At this time, the remaining portion of the silicon oxide film 31, the silicon nitride film 32, and the silicon oxide film 33 is used as a portion of the IPD film 15.

Fourth Embodiment

A fourth embodiment will now be described.

The embodiment also is an embodiment of a method for manufacturing the semiconductor memory device according to the first embodiment described above.

FIG. 15A to FIG. 18 are cross-sectional views of processes, showing the method for manufacturing the semiconductor memory device according to the embodiment.

Figures 15A, 15B, 15C, 15D:
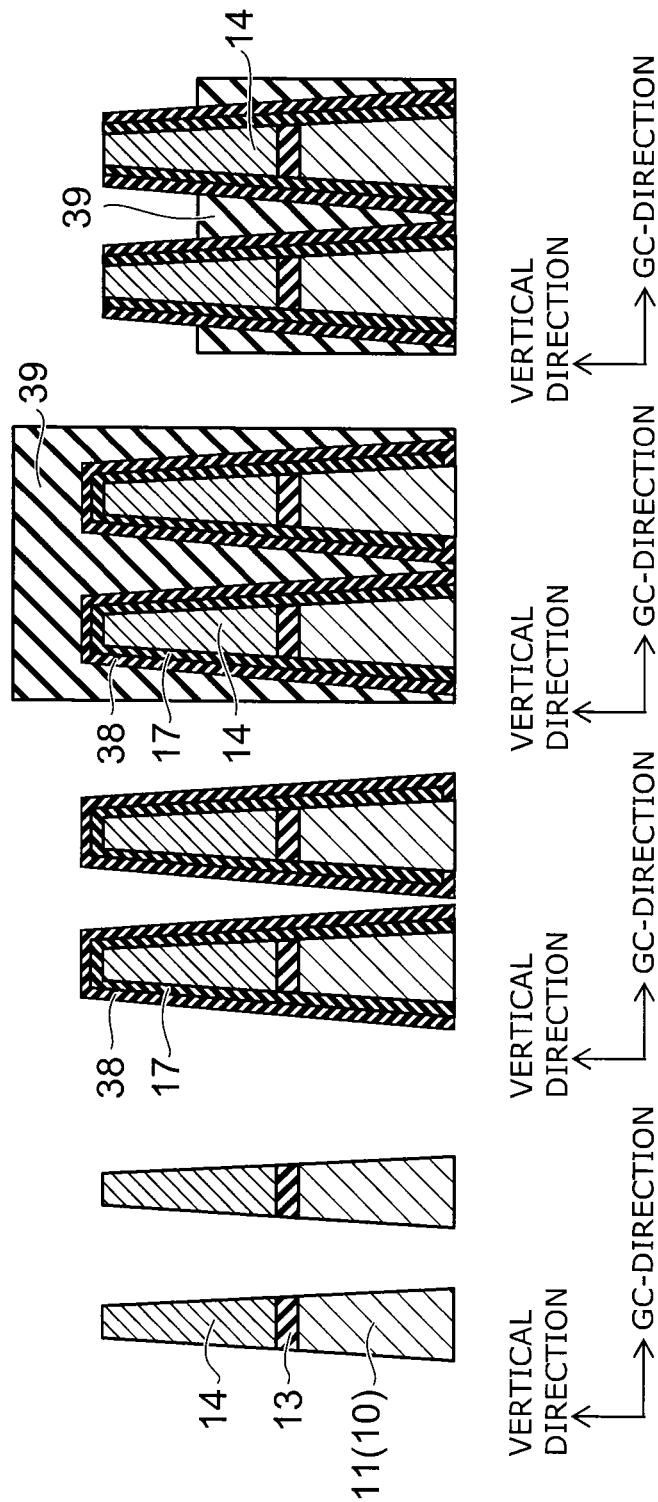

First, as shown in FIG. 15A, the tunneling insulating film 13 is formed on the silicon substrate 10; and the floating gate electrode 14 is formed on the tunneling insulating film 13. Then, etching is performed to divide the floating gate electrode 14 and the tunneling insulating film 13 into a stripe configuration extending in the AA-direction and selectively remove the upper portion of the silicon substrate 10 to divide the upper portion of the silicon substrate 10 into the multiple active areas 11 extending in the AA-direction.

Then, as shown in FIG. 15B, the liner silicon oxide film 17 is formed on the entire surface; and subsequently, the liner silicon nitride film 38 is formed.

Then, as shown in FIG. 15C, the silicon oxide film 39 is formed by coating PSZ (polysilazane) onto the entire surface and by heating.

Then, as shown in FIG. 15D, dry etching is performed using conditions at which silicon oxide is etched preferentially to silicon nitride. Thereby, the upper surface of the silicon oxide film 39 is caused to recede to a position corresponding to the vertical-direction central portion of the floating gate electrode 14.

Figures 16A, 16B, 16C, 16D:
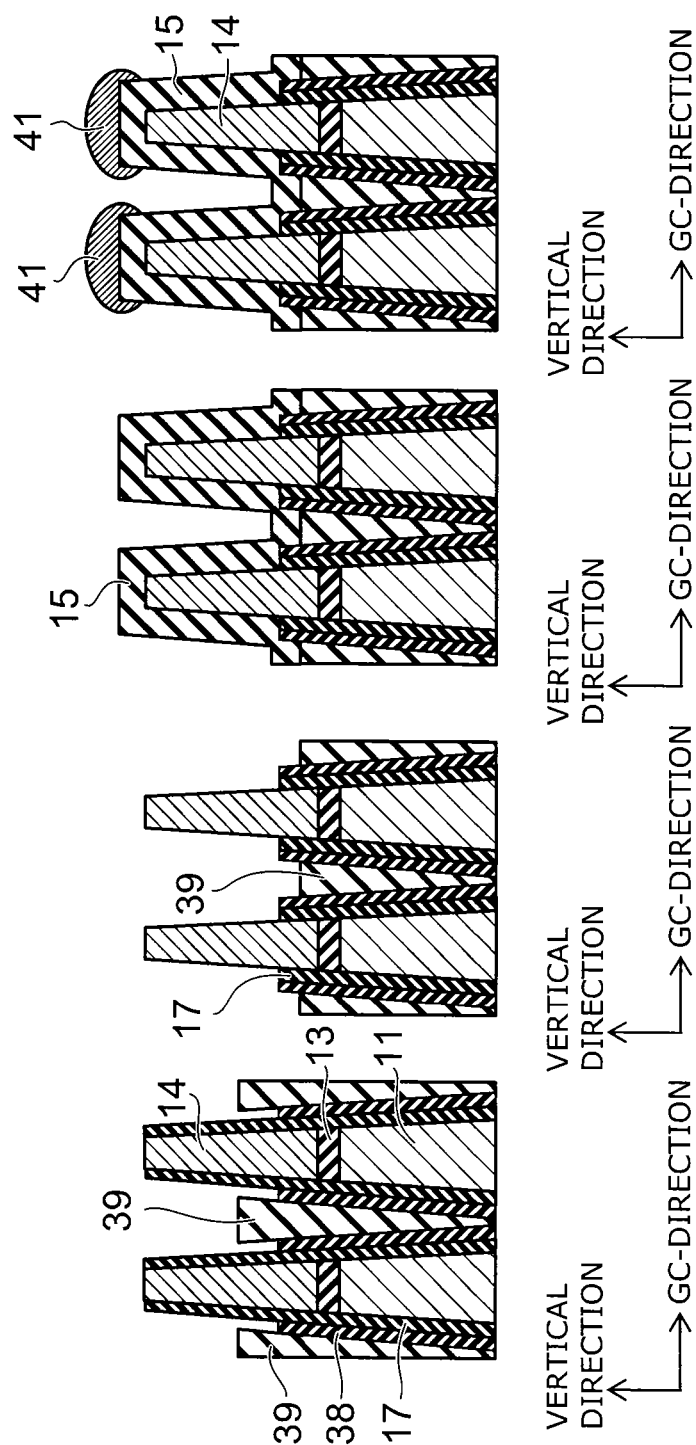

Then, as shown in FIG. 16A, wet etching is performed for a short period of time using phosphoric acid as the etchant. Thereby, the exposed portion of the liner silicon nitride film 38 and the upper portion of the portion of the liner silicon nitride film 38 disposed between the liner silicon oxide film 17 and the silicon oxide film 39 are removed.

Then, as shown in FIG. 16B, dry etching is performed using conditions at which silicon oxide is etched preferentially to silicon nitride. Thereby, the upper portion of the silicon oxide film 39 and the exposed portion of the liner silicon oxide film 17 are removed.

Then, as shown in FIG. 16C, the IPD film 15 is deposited on the entire surface after performing pre-processing.

Then, as shown in FIG. 16D, an amorphous silicon film 41 is adhered as a mask film over the upper end portion of the IPD film 15, i.e., the portion of the IPD film 15 covering the upper end portion of the floating gate electrode 14, by plasma CVD (chemical vapor deposition: chemical vapor deposition). At this time, although the amorphous silicon film 41 substantially does not enter the trench between the floating gate electrodes 14 that are adjacent to each other in the GC-direction and is adhered over only the upper end portion of the IPD film 15, the amorphous silicon film 41 juts slightly from the two side surfaces of the IPD film 15. Thereby, multiple mutually-separated amorphous silicon films 41 are formed respectively for the floating gate electrodes 14.

Then, as shown in FIG. 17A, RIE is performed using the amorphous silicon films 41 as a mask to remove the central portions of the portions of the IPD film 15 between the floating gate electrodes 14. Thereby, the IPD film 15 is divided every active area 11.

Then, as shown in FIG. 17B, the amorphous silicon films 41 are removed by performing wet etching.

Then, as shown in FIG. 17C, the control gate electrode 16 is formed on the entire surface by depositing polysilicon. Then, a hard mask member (not shown) that extends in the GC-direction is formed on the control gate electrode 16; and etching using the hard mask member as a mask is performed to selectively remove the structural body stacked on the silicon substrate 10. Thereby, the gate stacked bodies 20 that extend in the GC-direction are formed; and the space between the gate stacked bodies 20 becomes the air gap 21.

Then, as shown in FIG. 17D, the silicon oxide film 39 is removed by performing wet etching using DHF as the etchant. Thereby, the air gap 12 is made between the active areas 11. The portion of the IPD film 15 that covers the lower end portion of the downward-extending portion 16b of the control gate electrode 16 also is removed. Thereby, the lower end portion of the downward-extending portion 16b protrudes downward from the IPD film 15 into the air gap 12. At this time, the processing time of the wet etching can be set to be sufficiently long and the fluctuation of the depth of the air gap 12 can be reduced because the liner silicon oxide film 17 and the tunneling insulating film 13 are protected by the liner silicon nitride film 38.

Figure 18:
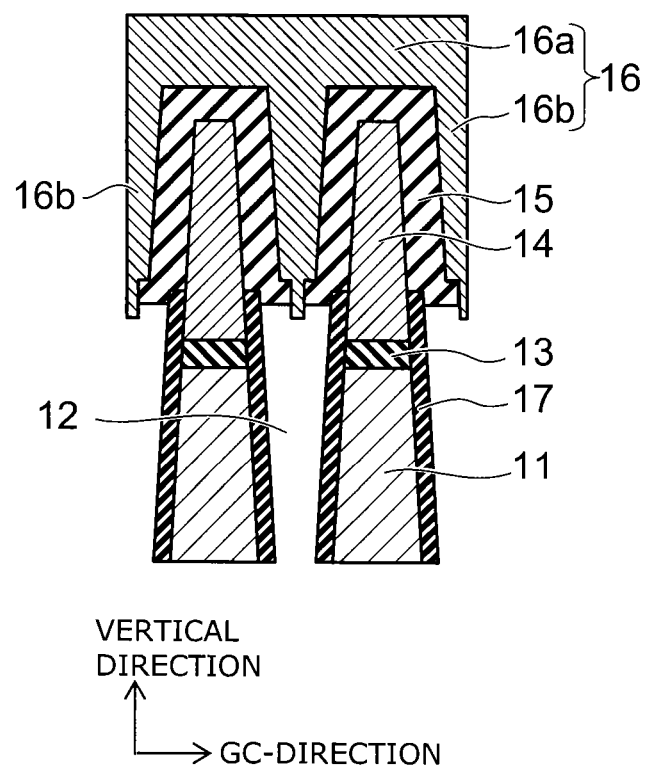

Then, as shown in FIG. 18, the liner silicon nitride film 38 is removed by performing wet etching using phosphoric acid as the etchant. At this time, the lower portion of the IPD film 15 also is removed slightly. Subsequently, the inter-layer insulating film 22 is formed above the gate stacked bodies 20 and the air gap 21. At this time, the silicon oxide film 23 is adhered over the side surfaces of the gate stacked bodies 20. The film thickness of the silicon oxide film 23 decreases downward.

Thus, the semiconductor memory device 1 according to the first embodiment described above is manufactured.

Fifth Embodiment

A fifth embodiment will now be described.

Figure 19:
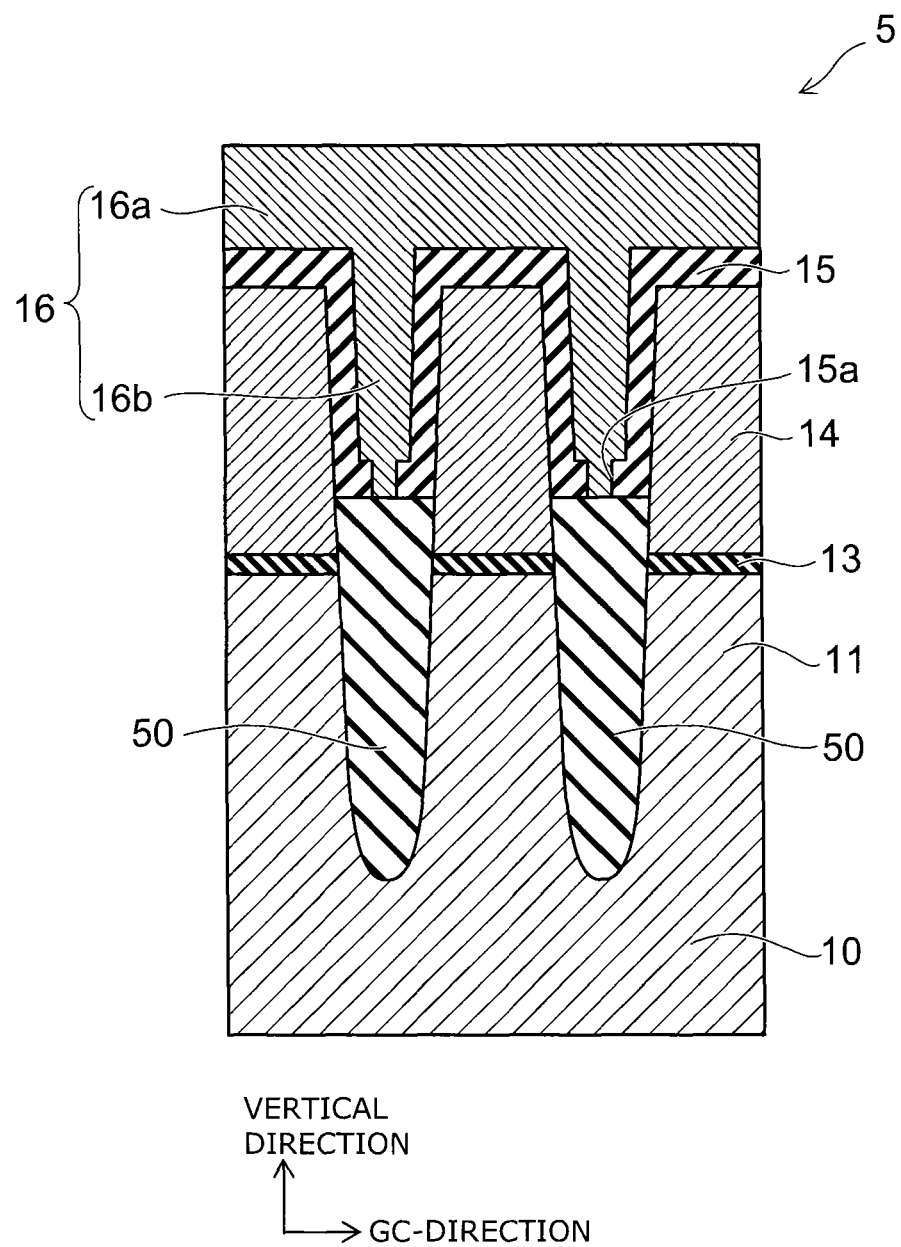
FIG. 19 is a cross-sectional view showing a semiconductor memory device according to a fifth embodiment.

FIG. 19 is a cross-sectional view showing a semiconductor memory device according to the embodiment.

As shown in FIG. 19, the semiconductor memory device 5 according to the embodiment differs from the semiconductor memory device 1 (referring to FIG. 2A to FIG. 2C) according to the first embodiment described above in that an element-separating insulator (STI) 50 is provided instead of the air gap 12 and the liner silicon oxide film 17. The STI 50 is formed of, for example, silicon oxide. The dielectric constant of the IPD film 15 is higher than the dielectric constant of the STI 50.

Also, in the device 5, similarly to the device 1, the IPD film 15 is divided between the floating gate electrodes 14 that are adjacent to each other in the GC-direction. The lower end portion of the downward-extending portion 16b of the control gate electrode 16 enters a divided portion 15a of the IPD film 15.

Operations and effects of the embodiment will now be described.

In the embodiment as well, similarly to the first embodiment described above, the lower end portion of the downward-extending portion 16b of the control gate electrode 16 is not covered with the IPD film 15. Therefore, the IPD film 15 is divided between the floating gate electrodes 14 that are adjacent to each other in the GC-direction. As a result, the parasitic capacitance between the floating gate electrodes 14 that are adjacent to each other in the GC-direction can be reduced.

Also, because the downward-extending portion 16b of the control gate electrode 16 enters the divided portion 15a of the IPD film 15, the electric field shielding effect improves; and the interference between the floating gate electrodes 14 that are adjacent to each other in the GC-direction can be suppressed.

Further, the breakdown voltage between the control gate electrode 16 and the active area 11 is high because the IPD film 15 which has a dielectric constant that is higher than that of the STI 50 is not interposed between the active area 11 and the lower end portion of the downward-extending portion 16b.

Otherwise, the configuration, the operations, and the effects of the embodiment are similar to those of the first embodiment described above.

Modification of Fifth Embodiment

A modification of the fifth embodiment will now be described.

Figure 20:
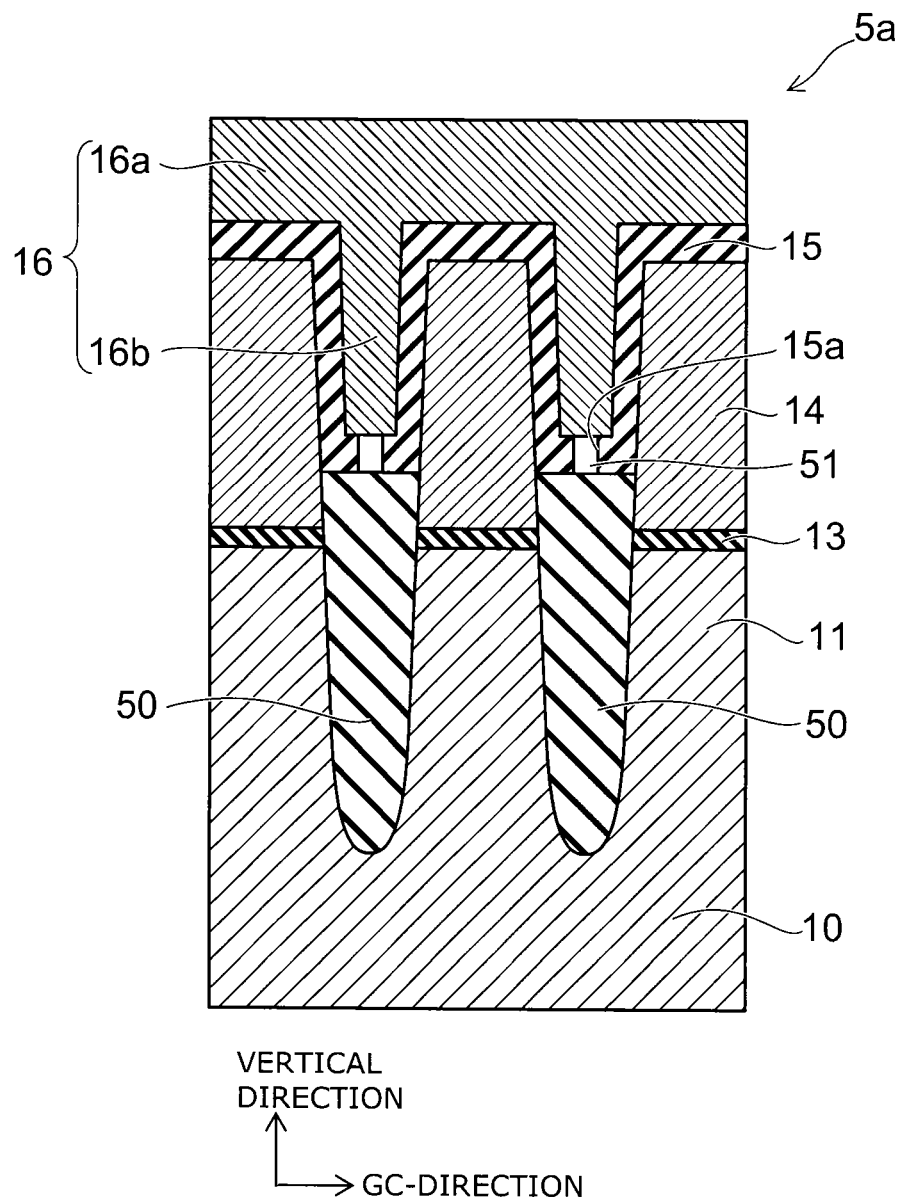
FIG. 20 is a cross-sectional view showing a semiconductor memory device according to a modification of the fifth embodiment.

FIG. 20 is a cross-sectional view showing a semiconductor memory device according to the modification.

In the semiconductor memory device 5a according to the modification as shown in FIG. 20, an air gap 51 is made in the divided portion 15a of the IPD film 15.

Otherwise, the configuration, the operations, and the effects of the modification are similar to those of the fifth embodiment described above.

Sixth Embodiment

A sixth embodiment will now be described.

The embodiment is an embodiment of a method for manufacturing the semiconductor memory device according to the fifth embodiment described above.

FIG. 21A to FIG. 22C are cross-sectional views of processes, showing the method for manufacturing the semiconductor memory device according to the embodiment.

Figures 21A, 21B, 21C:
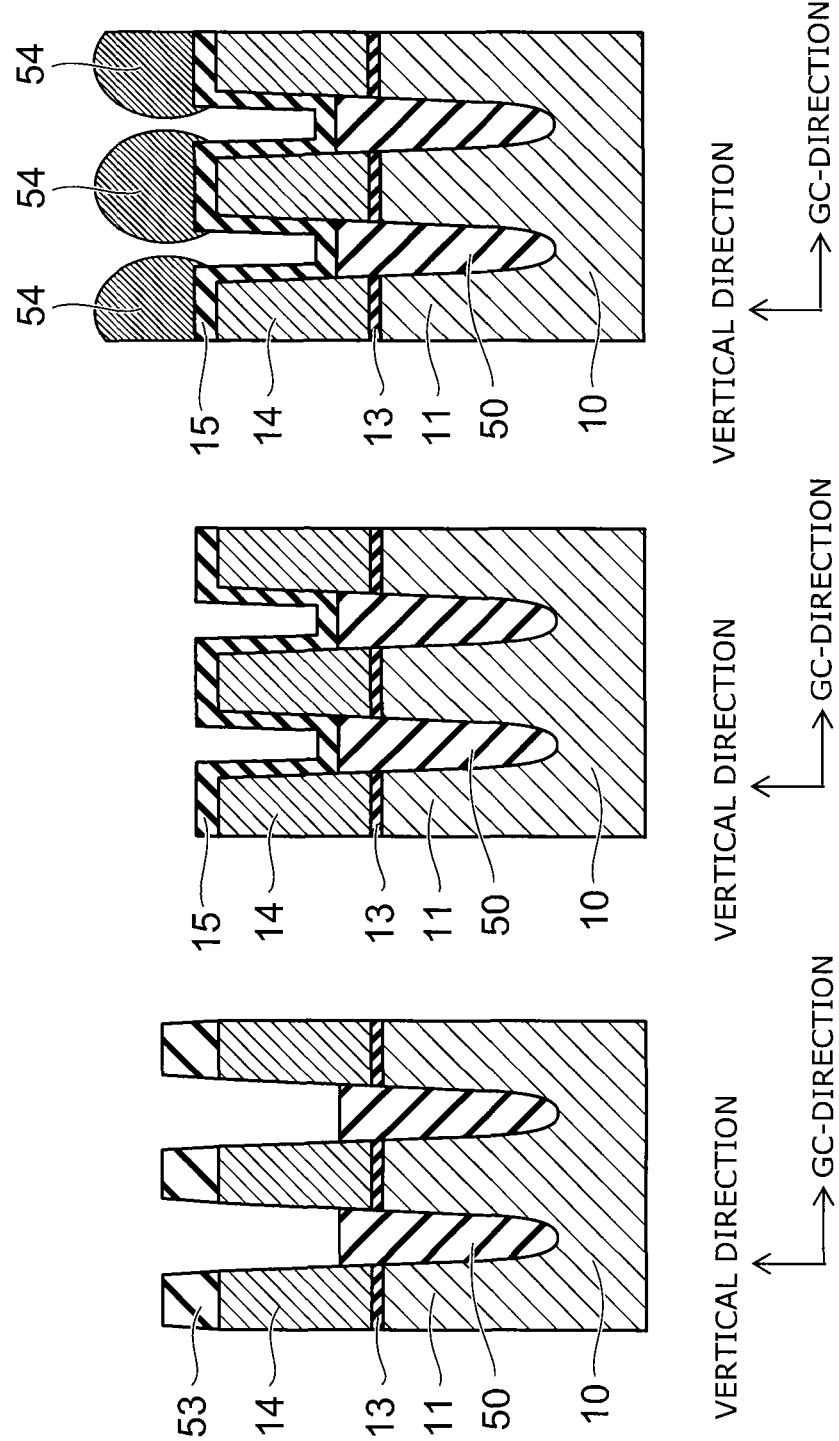

First, as shown in FIG. 21A, the tunneling insulating film 13 and the floating gate electrode 14 are formed on the entire surface of the silicon substrate 10. Then, a mask member 53 is formed in a stripe configuration extending in the AA-direction. Then, etching is performed using the mask member 53 as a mask to divide the floating gate electrode 14 and the tunneling insulating film 13 and form the active areas 11 by dividing the upper portion of the silicon substrate 10. Then, the STI 50 is formed between the stacked bodies that are made of the active area 11, the tunneling insulating film 13, and the lower portion of the floating gate electrode 14 by depositing silicon oxide on the entire surface and by performing etch-back.

Then, as shown in FIG. 21B, the IPD film 15 is formed on the entire surface.

Then, as shown in FIG. 21C, an amorphous silicon film 54 is adhered over the upper end portion of the IPD film 15, i.e., the portion of the IPD film 15 covering the upper end portion of the floating gate electrode 14, by performing a film formation method that has low coverage, e.g., low-temperature plasma CVD. At this time, although the amorphous silicon film 54 substantially does not enter between the floating gate electrodes 14, the two side portions of the amorphous silicon film 54 jut outside the side surfaces of the IPD film 15.

Figures 22A, 22B, 22C:
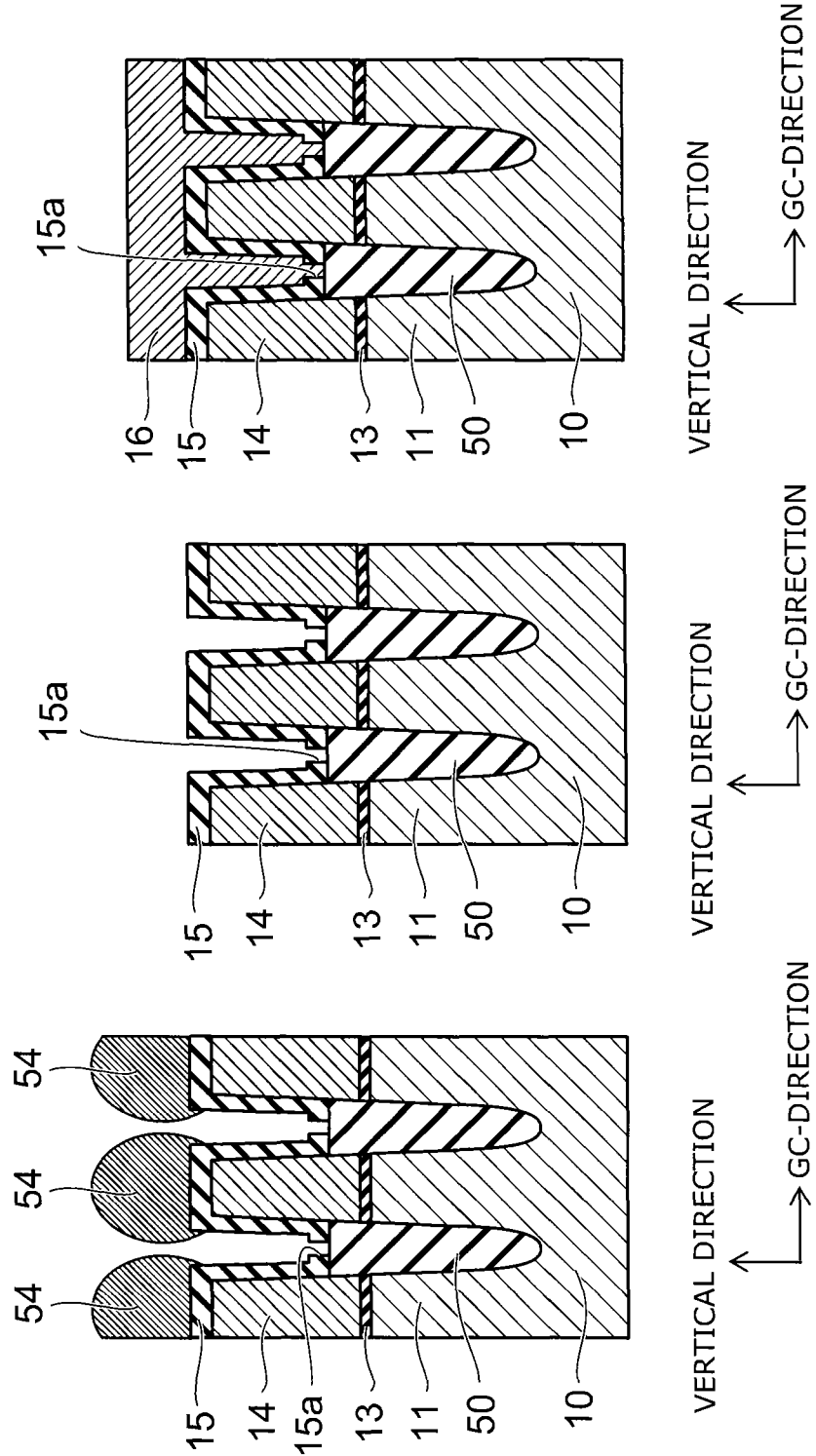

Then, as shown in FIG. 22A, RIE is performed using the amorphous silicon film 54 as a mask. Thereby, division is performed by removing the GC-direction central portion of the portion of the IPD film 15 that is disposed on the upper surface of the STI 50. In other words, the divided portion 15*a* is made in the IPD film 15.

Then, as shown in FIG. 22B, the amorphous silicon film 54 is removed by performing, for example, wet etching.

Then, as shown in FIG. 22C, the control gate electrode 16 is formed on the entire surface by depositing polysilicon. At this time, the polysilicon also enters the divided portion 15*a* of the IPD film 15. Then, the structural body on the silicon substrate 10 is divided along the AA-direction by being selectively removed to form the gate stacked bodies 20 extending in the GC-direction. Then, the inter-layer insulating film 22 (referring to FIG. 2A) is formed on the gate stacked bodies 20. Thus, the semiconductor memory device 5 according to the fifth embodiment described above is manufactured.

First Modification of the Sixth Embodiment

A first modification of the sixth embodiment will now be described.

The modification differs from the sixth embodiment described above in that a silicon nitride film is used instead of the amorphous silicon film as the mask when patterning the IPD film 15.

Figure 23A:
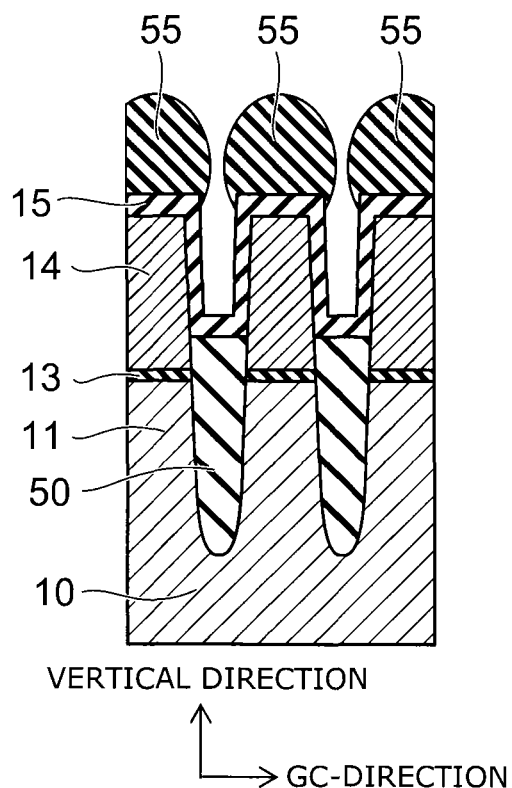
FIG. 23A and FIG. 23B are cross-sectional views of processes, showing a method for manufacturing a semiconductor memory device according to a first modification of the sixth embodiment.
Figure 23B:
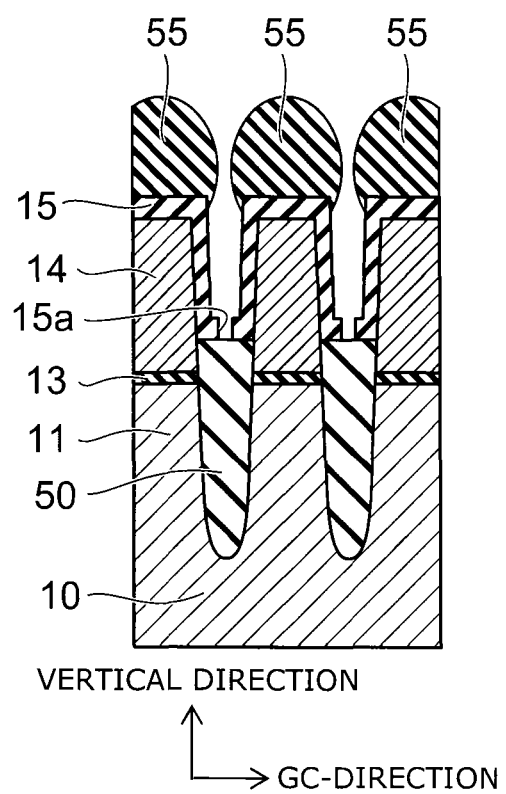

FIG. 23A and FIG. 23B are cross-sectional views of processes, showing a method for manufacturing the semiconductor memory device according to the modification.

First, the processes shown in FIG. 21A and FIG. 21B are implemented.

Then, as shown in FIG. 23A, a silicon nitride film 55 is adhered over the upper end portion of the IPD film 15 by performing a film formation method that has low coverage, e.g., low-temperature plasma CVD. At this time, although the silicon nitride film 55 substantially does not enter between the floating gate electrodes 14, the two side portions of the silicon nitride film 55 jut outside the side surfaces of the IPD film 15.

Then, as shown in FIG. 23B, RIE is performed using the silicon nitride film 55 as a mask to make the divided portion 15*a* in the IPD film 15. Then, the silicon nitride film 55 is removed. Then, the process shown in FIG. 22C is implemented. Otherwise, the manufacturing method of the modification is similar to that of the sixth embodiment described above.

Second Modification of the Sixth Embodiment

A second modification of the sixth embodiment will now be described.

Figure 24:
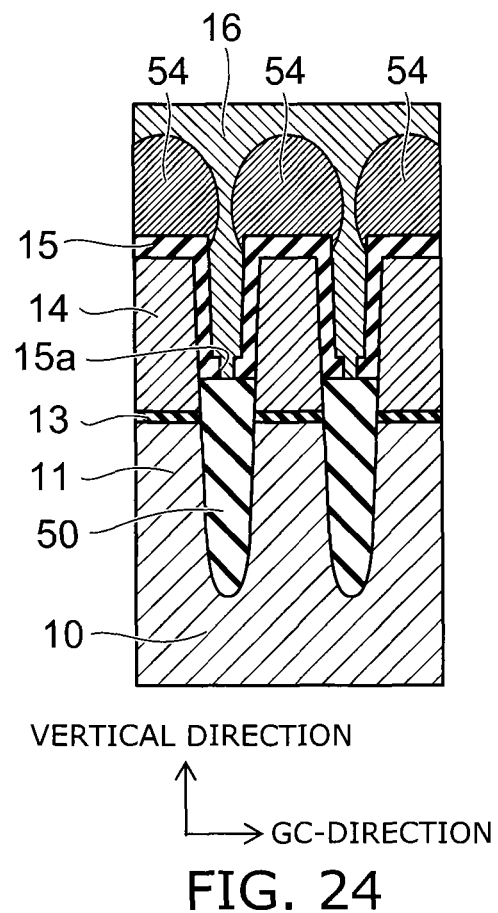
FIG. 24 is a cross-sectional view of a process, showing a method for manufacturing a semiconductor memory device according to a second modification of the sixth embodiment.

FIG. 24 is a cross-sectional view of a process, showing a method for manufacturing a semiconductor memory device according to the modification.

First, the processes shown in FIG. 21A to FIG. 22B are implemented. At this time, the amorphous silicon film 54 is caused to be conductive by the amorphous silicon film 54 containing an impurity.

Then, as shown in FIG. 24, polysilicon is deposited by a method having high coverage, e.g., LP-CVD (low pressure chemical vapor deposition), with the amorphous silicon film 54 remaining. Thereby, the polysilicon is filled between the IPD films 15 and between the amorphous silicon films 54 to form the control gate electrode 16 with the amorphous silicon films 54. The amorphous silicon films 54 are crystallized by subsequent heat treatment process. Otherwise, the manufacturing method of the modification is similar to that of the sixth embodiment described above.

Third Modification of the Sixth Embodiment

A third modification of the sixth embodiment will now be described.

FIG. 25A to FIG. 25D are cross-sectional views of processes, showing a method for manufacturing a semiconductor memory device according to the modification.

First, the processes shown in FIG. 21A, FIG. 21B, FIG. 23A, and FIG. 23B are implemented.

Figure 25:
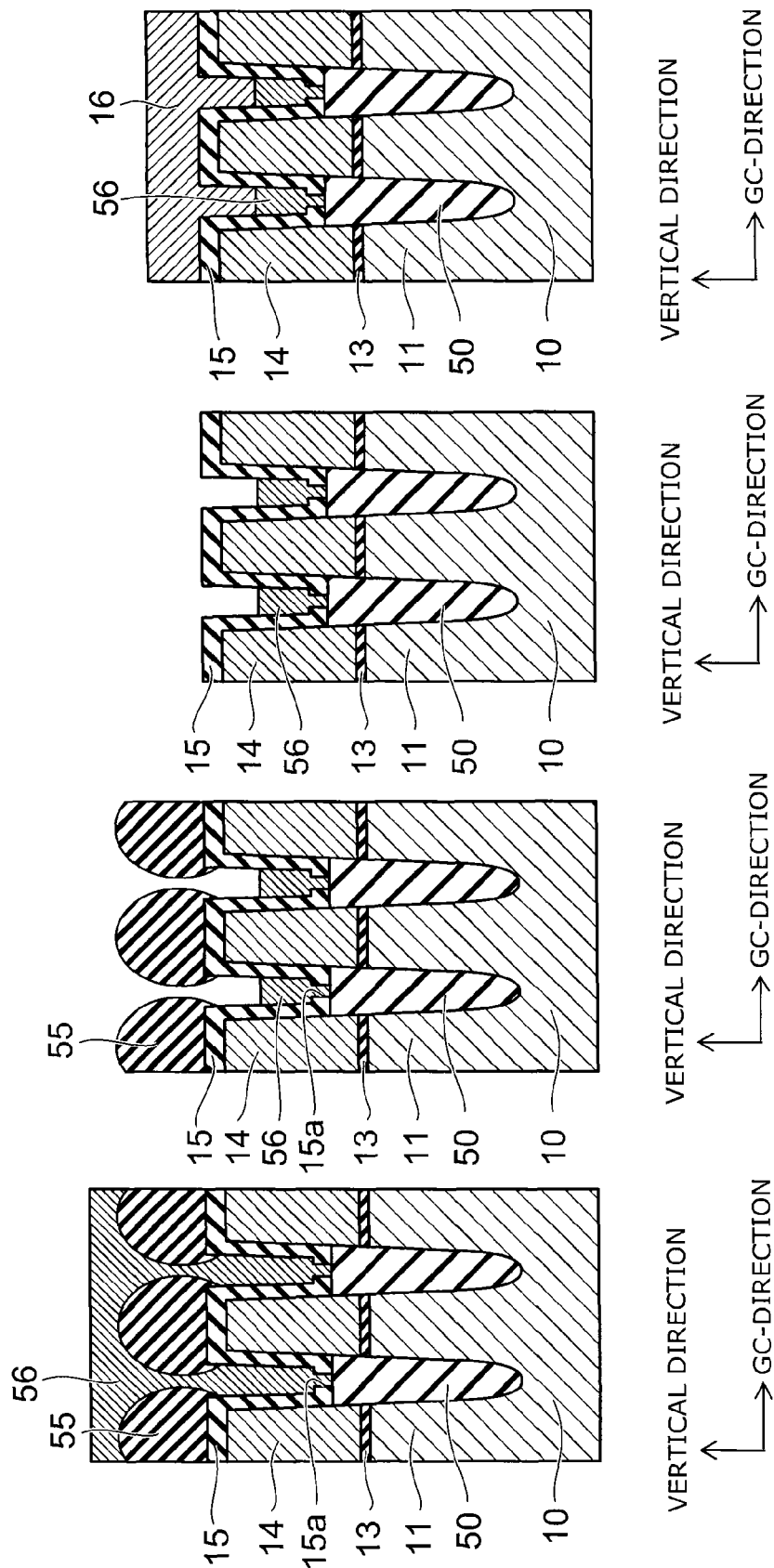
FIG. 25A to FIG. 25D are cross-sectional views of processes, showing a method for manufacturing a semiconductor memory device according to a third modification of the sixth embodiment.

Then, as shown in FIG. 25A, amorphous silicon is deposited by performing a film formation method having high coverage, e.g., LPCVD. Thereby, an amorphous silicon film 56 is formed between the IPD films 15, between the silicon nitride films 55, and on the silicon nitride films 55.

Then, as shown in FIG. 25B, etch-back of the amorphous silicon film 56 is performed such that the amorphous silicon film 56 remains between the lower portions of the floating gate electrodes 14.

Then, as shown in FIG. 25C, the silicon nitride films 55 are removed.

Then, as shown in FIG. 25D, polysilicon is deposited. The deposited polysilicon forms the control gate electrode 16 with the amorphous silicon film 56. The amorphous silicon film 56 is crystallized by subsequent heat treatment process. Otherwise, the manufacturing method of the modification is similar to that of the sixth embodiment described above.

Seventh Embodiment

A seventh embodiment will now be described.

Figure 26:
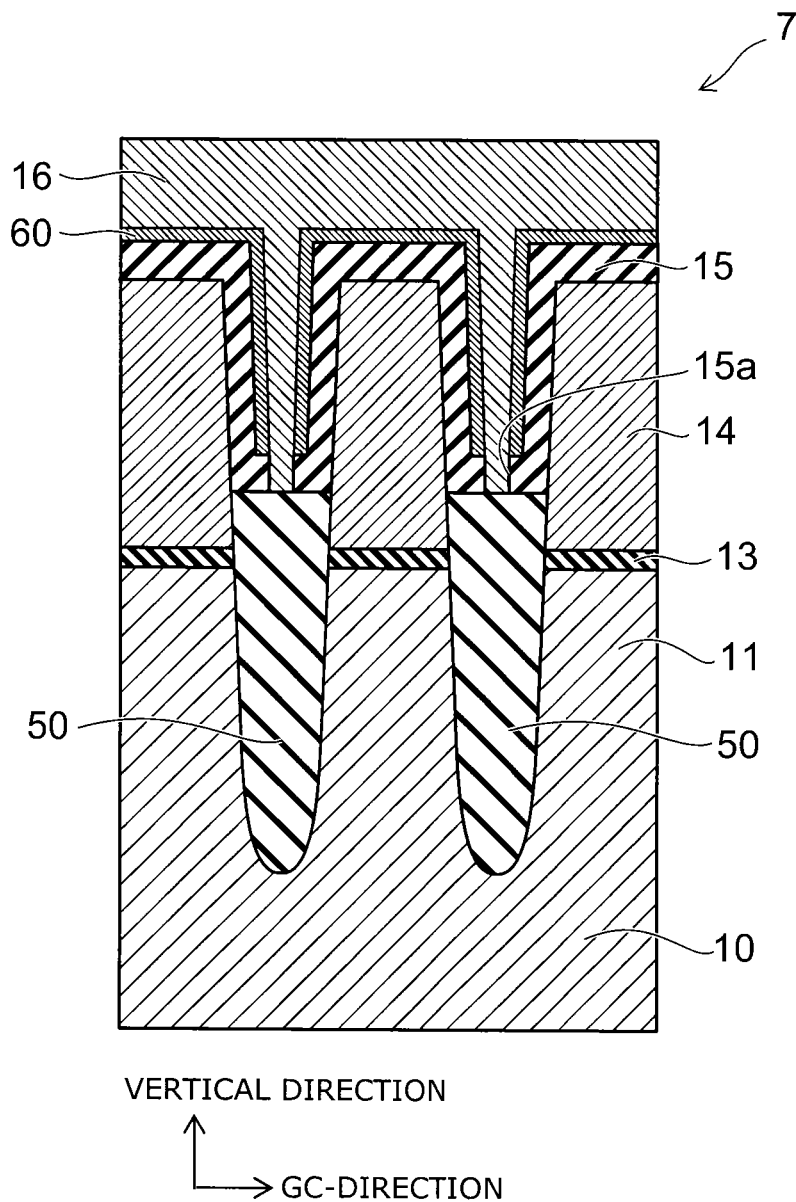
FIG. 26 is a cross-sectional view showing a semiconductor memory device according to a seventh embodiment.

FIG. 26 is a cross-sectional view showing a semiconductor memory device according to the embodiment.

In the semiconductor memory device 7 according to the embodiment as shown in FIG. 26, a barrier metal film 60 is provided between the IPD film 15 and the control gate electrode 16 in addition to the configuration of the device 5 according to the fifth embodiment described above. The barrier metal film 60 is not provided inside the divided portion 15*a* of the IPD film 15. The barrier metal film 60 is formed of a conductive material that has excellent heat resistance and oxidation resistance such as, for example, titanium nitride (TiN), tantalum nitride (TaN), etc. The material of the barrier metal film 60 is not limited to titanium nitride and tantalum nitride; and it is sufficient to be a conductive material including a metal. For example, a metal nitride other than titanium nitride and tantalum nitride, or a metal such as titanium, tantalum, etc., may be used.

In the embodiment, because the barrier metal film 60 is included in a portion of the control gate electrode 16 as a metal gate electrode, the control gate electrode 16 is not depleted even when a voltage is applied between the control gate electrode 16 and the active area 11. Thereby, the electric field can be applied effectively between the active area 11 and the floating gate electrode 14 without reducing the coupling ratio (CR) even when the voltage is applied between the control gate electrode 16 and the active area 11. Otherwise, the configuration, the operations, and the effects of the embodiment are similar to those of the fifth embodiment described above.

Eighth Embodiment

An eighth embodiment will now be described.

The embodiment is an embodiment of a method for manufacturing the semiconductor memory device according to the seventh embodiment described above.

FIG. 27A to FIG. 27D are cross-sectional views of processes, showing the method for manufacturing the semiconductor memory device according to the embodiment.

First, the processes shown in FIG. 21A and FIG. 21B are implemented.

Figure 27:
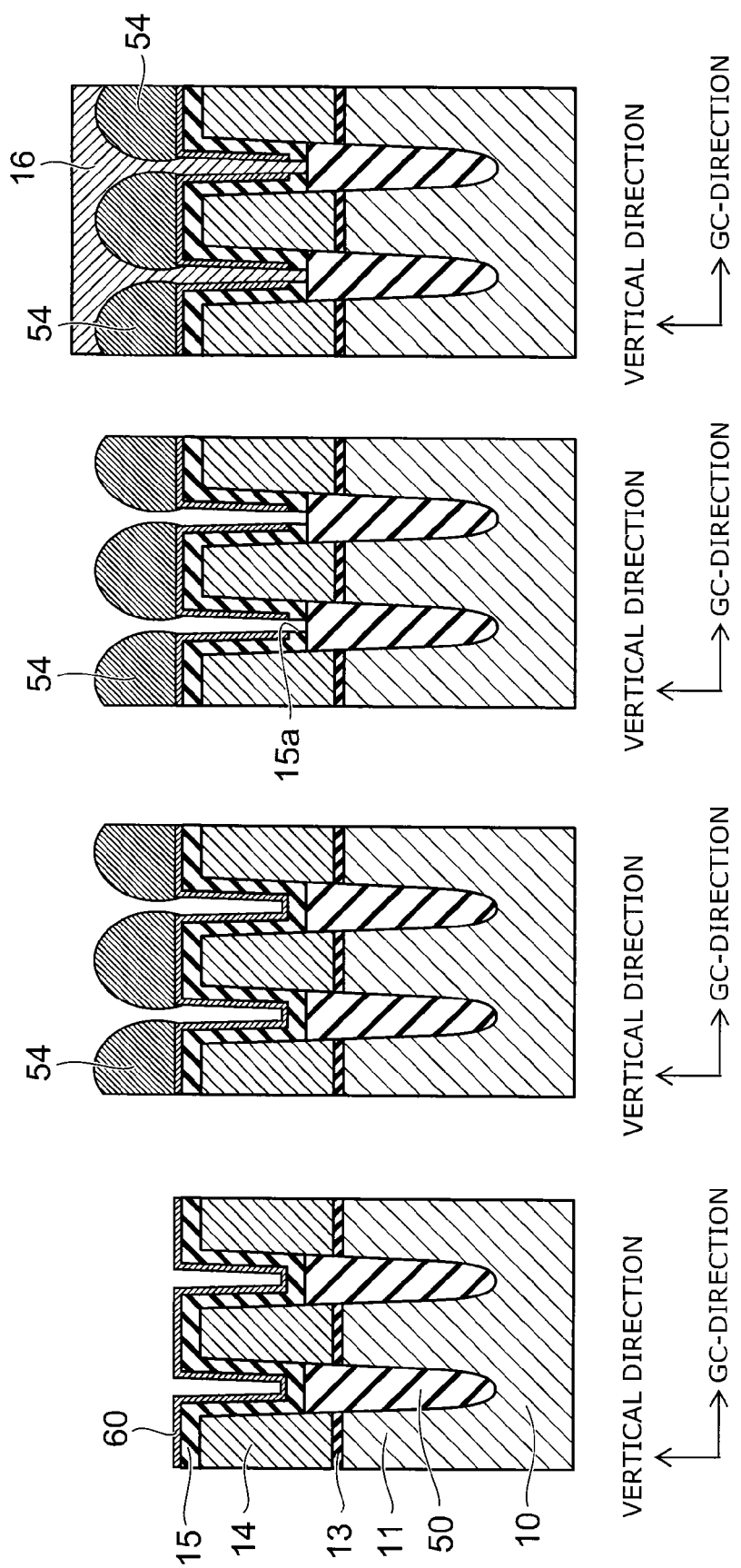
FIG. 27A to FIG. 27D are cross-sectional views of processes, showing the method for manufacturing the semiconductor memory device according to an eighth embodiment.

Then, as shown in FIG. 27A, the barrier metal film 60 is formed on the IPD film 15.

Then, as shown in FIG. 27B, the amorphous silicon film 54 is adhered over the upper end portion of the barrier metal film 60, i.e., the portion of the barrier metal film 60 covering the upper end portion of the floating gate electrode 14, by performing a film formation method that has low coverage, e.g., low-temperature plasma CVD. At this time, although the amorphous silicon film 54 substantially does not enter between the floating gate electrodes 14, the two side portions of the amorphous silicon film 54 jut outside the side surfaces of the IPD film 15.

Then, as shown in FIG. 27C, RIE is performed using the amorphous silicon film 54 as a mask. Thereby, the GC-direction central portion of the portion of the barrier metal film 60 and the IPD film 15 disposed on the upper surface of the STI 50 is removed. As a result, the barrier metal film 60 and the IPD film 15 are divided every floating gate electrode 14.

Then, as shown in FIG. 27D, polysilicon is deposited by a method having high coverage, e.g., LP-CVD, with the amorphous silicon films 54 remaining. Thereby, the polysilicon is filled between the IPD films 15 and between the amorphous silicon films 54 to form the control gate electrode 16 with the amorphous silicon films 54. The amorphous silicon films 54 are crystallized by subsequent heat treatment process. The subsequent processes are similar to those of the sixth embodiment described above. Thus, the semiconductor memory device 7 according to the seventh embodiment described above is manufactured.

Because the embodiment includes merely forming a thin barrier metal film 60 on the IPD film 15, it is unnecessary to form a thick hard mask as in the processes for forming a so-called metal gate. Therefore, the method according to the embodiment is inexpensive.

Ninth Embodiment

A ninth embodiment will now be described.

Figure 28:
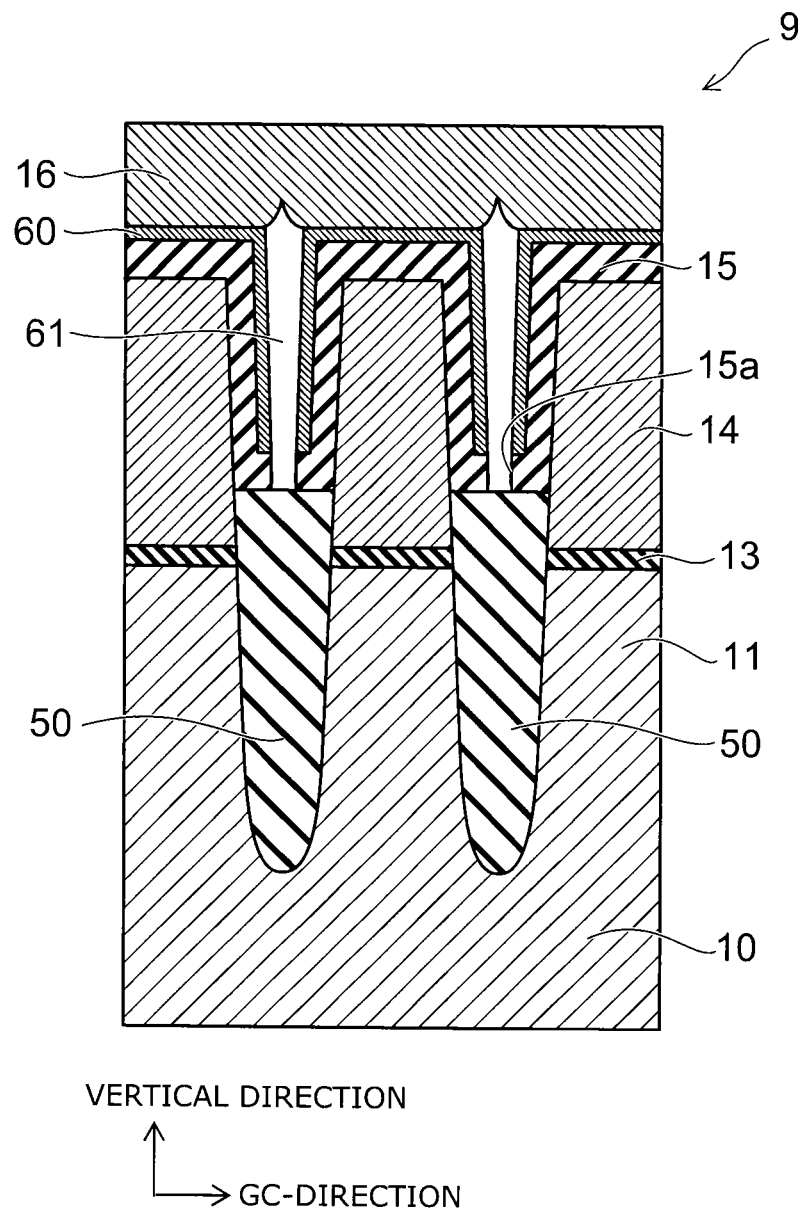
FIG. 28 is a cross-sectional view showing a semiconductor memory device according to a ninth embodiment.

FIG. 28 is a cross-sectional view showing a semiconductor memory device according to the embodiment.

As shown in FIG. 28, the semiconductor memory device 9 according to the embodiment differs from the device 7 according to the seventh embodiment described above in that an air gap 61 is made instead of the downward-extending portion 16b of the control gate electrode 16. The air gap 61 also is made in the divided portion 15a of the IPD film 15. The inner surface of the upper end portion of the air gap 61 is bent to have an acute angle.

According to the embodiment, because the air gap 61 is disposed between the floating gate electrodes 14 that are adjacent to each other in the GC-direction, the interference between the floating gate electrodes 14 can be suppressed more effectively. Also, electrons can be prevented from passing through the IPD film 15 and moving in the GC-direction. Otherwise, the configuration, the operations, and the effects of the embodiment are similar to those of the seventh embodiment described above.

Tenth Embodiment

A tenth embodiment will now be described.

The embodiment is an embodiment of a method for manufacturing the semiconductor memory device according to the ninth embodiment described above.

Figure 29:
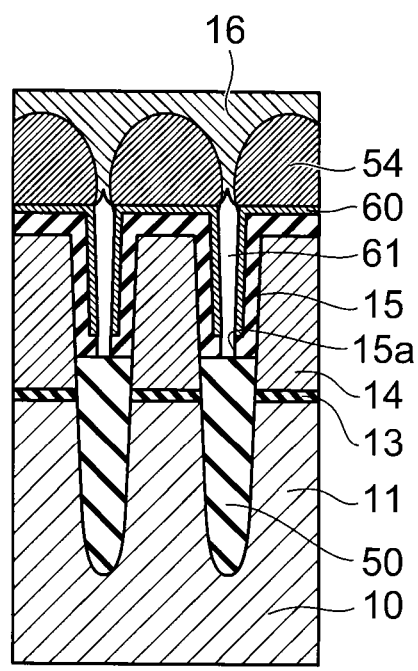
FIG. 29 is a cross-sectional view of a process, showing the method for manufacturing the semiconductor memory device according to a tenth embodiment.

FIG. 29 is a cross-sectional view of a process, showing the method for manufacturing the semiconductor memory device according to the embodiment.

First, the processes shown in FIG. 21A, FIG. 21B, FIG. 27A, FIG. 27B, and FIG. 27C are implemented.

Then, as shown in FIG. 29, polysilicon is deposited by a film formation method that has low coverage, e.g., low-temperature plasma CVD, with the amorphous silicon films 54 remaining. Thereby, the polysilicon is deposited on the amorphous silicon films 54 to seal the gap between the amorphous silicon films 54. Then, the control gate electrode 16 is formed with the amorphous silicon films 54. At this time, the air gap 61 is made by the polysilicon not being filled between the floating gate electrodes 14. Thus, the semiconductor memory device 7 according to the ninth embodiment described above is manufactured. Otherwise, the manufacturing method of the embodiment is similar to that of the eighth embodiment described above.

According to the embodiments described above, even in the case where the cell structure is downscaled, a semiconductor memory device and a method for manufacturing the semiconductor memory device can be realized in which the interference between the floating gate electrodes can be suppressed and the breakdown voltage between the silicon substrate and the control gate electrode can be ensured.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device, comprising:
a semiconductor substrate;
a first insulating film provided on the semiconductor substrate;
a plurality of first electrodes provided on the first insulating film, the plurality of first electrodes being arranged in a first direction;
a second insulating film provided on a side surface of the first electrodes and on an upper surface of the first electrodes; and
a second electrode insulated from the first electrodes by the second insulating film,
the second electrode including:
an interconnect portion provided on the second insulating film and extending in the first direction; and a downward-extending portion extending into a space between the first electrodes from the interconnect portion, a lower surface and a side surface facing the first direction of a lower end portion of the downward-extending portion not being covered with the second insulating film.

2. The semiconductor memory device according to claim 1, wherein an air gap is made around the lower end portion of the downward-extending portion.

3. A semiconductor memory device, comprising:
   a semiconductor substrate;
   a first insulating film provided on the semiconductor substrate;
   a plurality of first electrodes provided on the first insulating film;
   a second insulating film provided on a side surface of the first electrodes and on an upper surface of the first electrodes;
   a second electrode insulated from the first electrodes by the second insulating film,
   the second electrode including:
      an interconnect portion provided on the second insulating film; and
      a downward-extending portion extending into a space between the first electrodes from the interconnect portion,
   a lower end portion of the downward-extending portion not being covered with the second insulating film; and
   an element-separating insulator provided around the lower end portion of the downward-extending portion, a dielectric constant of the second insulating film being higher than a dielectric constant of the element-separating insulator.

4. The semiconductor memory device according to claim 1, wherein at least a portion of the downward-extending portion is formed of a conductive material including a metal.

5. The semiconductor memory device according to claim 1, wherein an air gap is made between the first electrodes.

6. A semiconductor memory, comprising:
   a semiconductor substrate;
   a first insulating film provided on the semiconductor substrate;
   a plurality of first electrodes provided on the first insulating film;
   a second insulating film provided on a side surface of the first electrodes and on an upper surface of the first electrodes; and
   a second electrode insulated from the first electrodes by the second insulating film,
   the second electrode including:
      an interconnect portion provided on the second insulating film; and
      a downward-extending portion extending into a space between the first electrodes from the interconnect portion,
   a lower end portion of the downward-extending portion not being covered with the second insulating film;
   wherein the second insulating film is divided between the first electrodes.

* * * * *